(12) United States Patent
Hirashima et al.

(10) Patent No.: US 11,218,141 B2
(45) Date of Patent: *Jan. 4, 2022

(54) CORRECTION CIRCUIT

(71) Applicant: KIOXIA CORPORATION, Tokyo (JP)

(72) Inventors: Yasuhiro Hirashima, Kawasaki Kanagawa (JP); Masaru Koyanagi, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/723,823

(22) Filed: Dec. 20, 2019

(65) Prior Publication Data

US 2020/0127653 A1    Apr. 23, 2020

Related U.S. Application Data

(63) Continuation of application No. 16/120,295, filed on Sep. 2, 2018, now Pat. No. 10,530,350.

(30) Foreign Application Priority Data

Mar. 23, 2018  (JP) ............................. JP2018-055513

(51) Int. Cl.
*H03K 5/01* (2006.01)
*H03K 5/156* (2006.01)
(Continued)

(52) U.S. Cl.
CPC ............. *H03K 5/1565* (2013.01); *G06F 1/06* (2013.01); *H03K 5/06* (2013.01); *H03K 5/26* (2013.01);
(Continued)

(58) Field of Classification Search
CPC ... G06F 1/06; H03K 5/01; H03K 5/04; H03K 5/05; H03K 5/06; H03K 5/26;
(Continued)

(56) References Cited

U.S. PATENT DOCUMENTS 7,423,465 B2    9/2008  Gomm
7,612,593 B2 *  11/2009  Kim ......................... G11C 7/22
                                                        327/175

(Continued)

FOREIGN PATENT DOCUMENTS

JP          3488153 B2    1/2004

*Primary Examiner* — Long Nguyen
(74) *Attorney, Agent, or Firm* — Kim & Stewart LLP

(57) ABSTRACT

A correction circuit includes a first detection unit, a second detection unit, a delay unit, and a waveform shaping unit. The first detection unit is configured to measure a first period of a high level of a first clock. The second detection unit is configured to measure a second period of a high level of a second clock that is complementary to the first clock. The delay unit is configured to generate a first delay clock and a second delay clock according to a difference between the first period and the second period. The waveform shaping unit is configured to generate a third clock having a logic level which is switched based on an edge of the first delay clock and an edge of the second delay clock.

20 Claims, 20 Drawing Sheets

(51) Int. Cl.
*H03L 7/099* (2006.01)
*H03K 5/26* (2006.01)
*H03K 5/06* (2006.01)
*H03L 7/07* (2006.01)
*H03K 7/08* (2006.01)
*G06F 1/06* (2006.01)

(52) U.S. Cl.
CPC ............... *H03K 7/08* (2013.01); *H03L 7/07* (2013.01); *H03L 7/0995* (2013.01)

(58) Field of Classification Search
CPC ........... H03K 5/1565; H03L 7/07; H03L 7/08; H03L 7/0995
See application file for complete search history.

(56) References Cited

U.S. PATENT DOCUMENTS 7,847,609 B2 * 12/2010 Shin ................. H03K 5/159
327/175
10,530,350 B2 * 1/2020 Hirashima ............ H03L 7/0995

* cited by examiner

| CODE_A[3:0] | CONTENT OF INDICATION |
|---|---|
| 000 | DEFAULT (MINIMUM DELAY) |
| 001 | DELAY OF ONE UNIT TIME (= Tw) |
| 010 | DELAY OF TWO UNIT TIME (= 2Tw) |
| 011 | DELAY OF THREE UNIT TIME (= 3Tw) |
| 100 | DELAY OF FOUR UNIT TIME (= 4Tw) |
| 101 | DELAY OF FIVE UNIT TIME (= 5Tw) |
| 110 | DELAY OF SIX UNIT TIME (= 6Tw) |
| 111 | DELAY OF SEVEN UNIT TIME (= 7Tw) |

FIG. 12

| CODE_B[3:0] | CONTENT OF INDICATION |
|---|---|
| 000 | DEFAULT (MINIMUM DELAY) |
| 001 | DELAY OF ONE UNIT TIME (= Tw) |
| 010 | DELAY OF TWO UNIT TIME (= 2Tw) |
| 011 | DELAY OF THREE UNIT TIME (= 3Tw) |
| 100 | DELAY OF FOUR UNIT TIME (= 4Tw) |
| 101 | DELAY OF FIVE UNIT TIME (= 5Tw) |
| 110 | DELAY OF SIX UNIT TIME (= 6Tw) |
| 111 | DELAY OF SEVEN UNIT TIME (= 7Tw) |

FIG. 13

| CODE_A[3:0] | AF_1 | AF_2 | AF_3 | AF_4 | AF_5 | AF_6 | AF_7 | AF_8 |
|---|---|---|---|---|---|---|---|---|
| 000 | L | L | L | L | L | L | L | H |
| 001 | L | L | L | L | L | L | H | L |
| 010 | L | L | L | L | L | H | L | L |
| 011 | L | L | L | L | H | L | L | L |
| 100 | L | L | L | H | L | L | L | L |
| 101 | L | L | H | L | L | L | L | L |
| 110 | L | H | L | L | L | L | L | L |
| 111 | H | L | L | L | L | L | L | L |

FIG. 14

| CODE_B[3:0] | AF'_1 | AF'_2 | AF'_3 | AF'_4 | AF'_5 | AF'_6 | AF'_7 | AF'_8 |
|---|---|---|---|---|---|---|---|---|
| 000 | L | L | L | L | L | L | L | H |
| 001 | L | L | L | L | L | L | H | L |
| 010 | L | L | L | L | L | H | L | L |
| 011 | L | L | L | L | H | L | L | L |
| 100 | L | L | L | H | L | L | L | L |
| 101 | L | L | H | L | L | L | L | L |
| 110 | L | H | L | L | L | L | L | L |
| 111 | H | L | L | L | L | L | L | L |

FIG. 24

| SC[3:1] | | | SF[4:1] | | | |
|---|---|---|---|---|---|---|
| SC_3 | SC_2 | SC_1 | SF_4 | SF_3 | SF_2 | SF_1 |
| L | L | L | L | L | L | H |
| L | L | L | L | H | L | H |
| L | L | L | L | H | H | H |
| L | L | L | H | H | H | H |
| L | L | H | L | L | L | L |
| L | L | H | L | L | L | H |
| L | L | H | L | H | L | H |
| L | L | H | L | H | H | H |
| L | L | H | H | H | H | H |
| L | H | L | L | L | L | L |

//  # CORRECTION CIRCUIT

CROSS-REFERENCE TO RELATED APPLICATIONS

This application is a continuation of U.S. patent application Ser. No. 16/120,295, filed Sep. 2, 2018, which application is based upon and claims the benefit of priority from Japanese Patent Application No. 2018-055513, filed Mar. 23, 2018, the entire contents of which are incorporated herein by reference.

FIELD

Embodiments described herein relate generally to a correction circuit.

BACKGROUND

A correction circuit capable of adjusting a duty cycle of a received clock is known.

DESCRIPTION OF THE DRAWINGS

FIG. 12 illustrates an example of values of another code signal, according to the first embodiment.

FIG. 13 illustrates an example of a relationship between the code signal and a decoded signal, according to the first embodiment.

FIG. 14 illustrates an example of a relationship between another code signal and the decoded signal, according to the first embodiment.

FIG. 24 illustrates an example of output signals of the detection unit according to the second embodiment.

DETAILED DESCRIPTION

Figure 1:
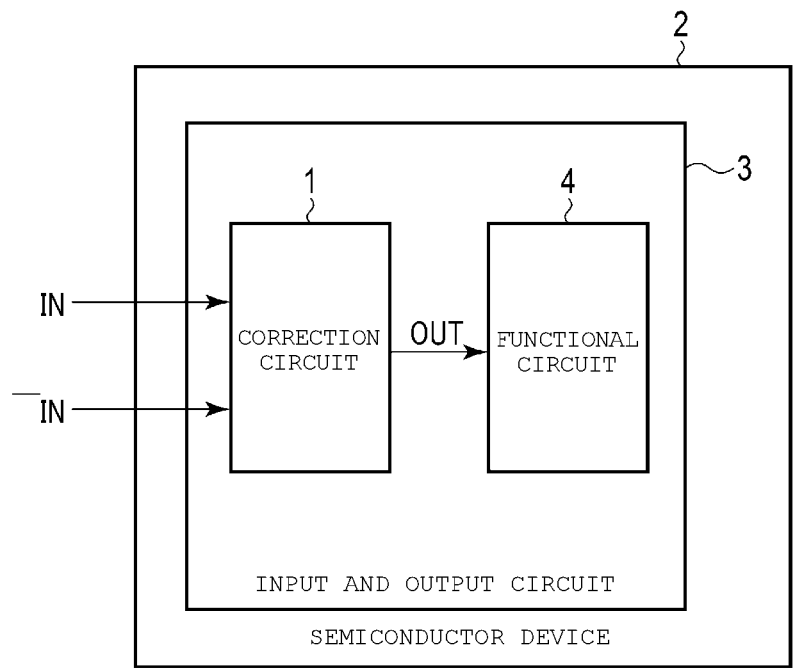
FIG. 1 illustrates a functional block of a semiconductor device including a correction circuit according to a first embodiment.

Embodiments provide a correction circuit which improves adjustment of a duty cycle.

In general, according to one embodiment, a correction circuit includes a first detection unit, a second detection unit, a delay unit, and a waveform shaping unit. The first detection unit is configured to measure a first period of a high level of a first clock. The second detection unit is configured to measure a second period of a high level of a second clock that is complementary to the first clock. The delay unit is configured to generate a first delay clock and a second delay clock according to a difference between the first period and the second period. The waveform shaping unit is configured to generate a third clock having a logic level which is switched based on an edge of the first delay clock and an edge of the second delay clock.

Hereinafter, embodiments will be described with reference to the drawings. In the following description, configuration elements having substantially the same function and configuration are denoted by the same reference numerals or symbols, and description may not be repeated. Description on a certain embodiment may be applicable to another embodiment, unless explicitly or obviously excluded.

Each functional block can be realized by any one of hardware and computer software, or a combination of both. In addition, it is not necessary that each functional block be distinguished as in the following example. For example, a part of the functions may be performed by a functional block other than the depicted functional block. Furthermore, the depicted functional block may be divided into finer functional sub-blocks. Embodiments are not limited to which functional block is specified.

In the present specification and claims, the fact that a first element is "connected" to a second element includes that the first element is directly connected to the second element or is connected to the second element constantly or selectively via a conductive element.

First Embodiment 1.1. Structure (Configuration)

FIG. 1 illustrates a functional block of a semiconductor device including a correction circuit according to a first embodiment. The correction circuit 1 can be provided in an input and output circuit 3 of the semiconductor device 2 such as a semiconductor memory device. The semiconductor device 2 can be formed as, for example, a semiconductor integrated circuit formed on a silicon substrate 2. The semiconductor device 2 receives input clocks IN and ⁻IN in a digital form from the outside (for example, a controller).

A signal of a name added with a symbol "⁻" at the beginning has an inverted logic with respect to a signal of a name without the symbol "⁻".

The input clocks IN and ⁻IN are received by the correction circuit 1. The correction circuit 1 generates an output clock OUT by using the input clocks IN and ⁻IN and outputs the output clock OUT. The output clock OUT is received by another functional circuit 4 in the semiconductor device 2. The output clock OUT has a duty cycle different from duty cycles of the input clocks IN and ⁻IN.

Figure 2:
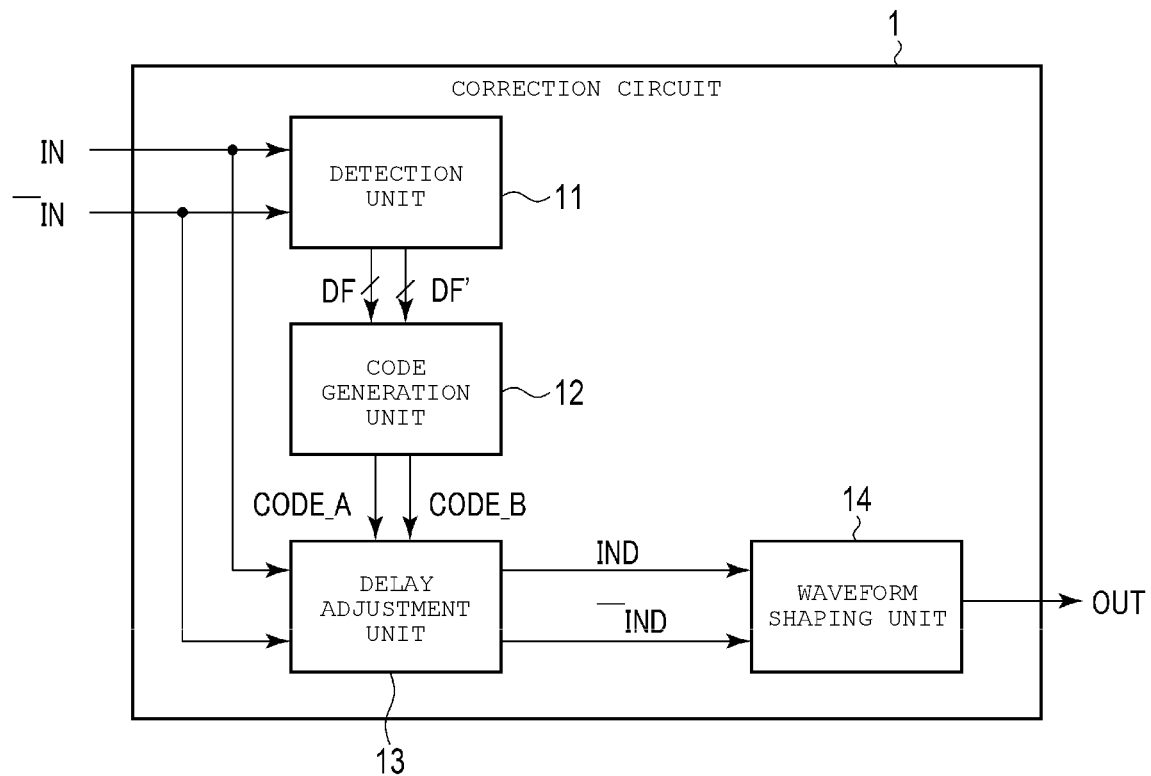
FIG. 2 illustrates the functional block of the correction circuit according to the first embodiment.

FIG. 2 illustrates a functional block of the correction circuit 1 according to the first embodiment. As illustrated in FIG. 2, the correction circuit 1 includes a detection unit 11, a code generation unit 12, a delay adjustment unit 13, and a waveform shaping unit 14.

The detection unit 11 detects (measures) a pulse width (a high-level period) of the input clock IN and a pulse width of the input clock ⁻IN, and outputs a signal DF indicating the pulse width of the input clock IN and a signal DF' indicating the pulse width of the input clock ⁻IN. Each of the signals DF and DF' has a plurality of bits.

The code generation unit 12 receives the signals DF and DF' and compares the pulse width of the input clock IN indicated by the signal DF with the pulse width of the input clock ⁻IN indicated by the signal DF'. The code generation unit 12 generates a code signal CODE_A and a code signal CODE_B, based on the comparison result. The code signal CODE_A and the code signal CODE_B include information indicating which one of the pulse width of the input clock IN and the pulse width of the input clock ⁻IN is larger and a difference between the pulse width of the input clock IN and the pulse width of the input clock to ⁻IN.

The delay adjustment unit 13 also receives the input clocks IN and ⁻IN. The delay adjustment unit 13 also receives the code signals CODE_A and CODE_B. The delay adjustment unit 13 generates a delay input clock IND from the input clock IN and generates a delay input clock ⁻IND from the input clock ⁻IN, based on the information included in the code signals CODE_A and CODE_B. The delay input clock IND is delayed by variable quantity based on the code signal CODE_A from the input clock IN. The delay input clock ⁻IND is delayed by variable quantity based on the code signal CODE_B from the input clock ⁻IN.

The waveform shaping unit 14 receives the delay input clocks IND and ⁻IND and generates the output clock OUT using the delay input clocks IND and ⁻IND.

Figure 3:
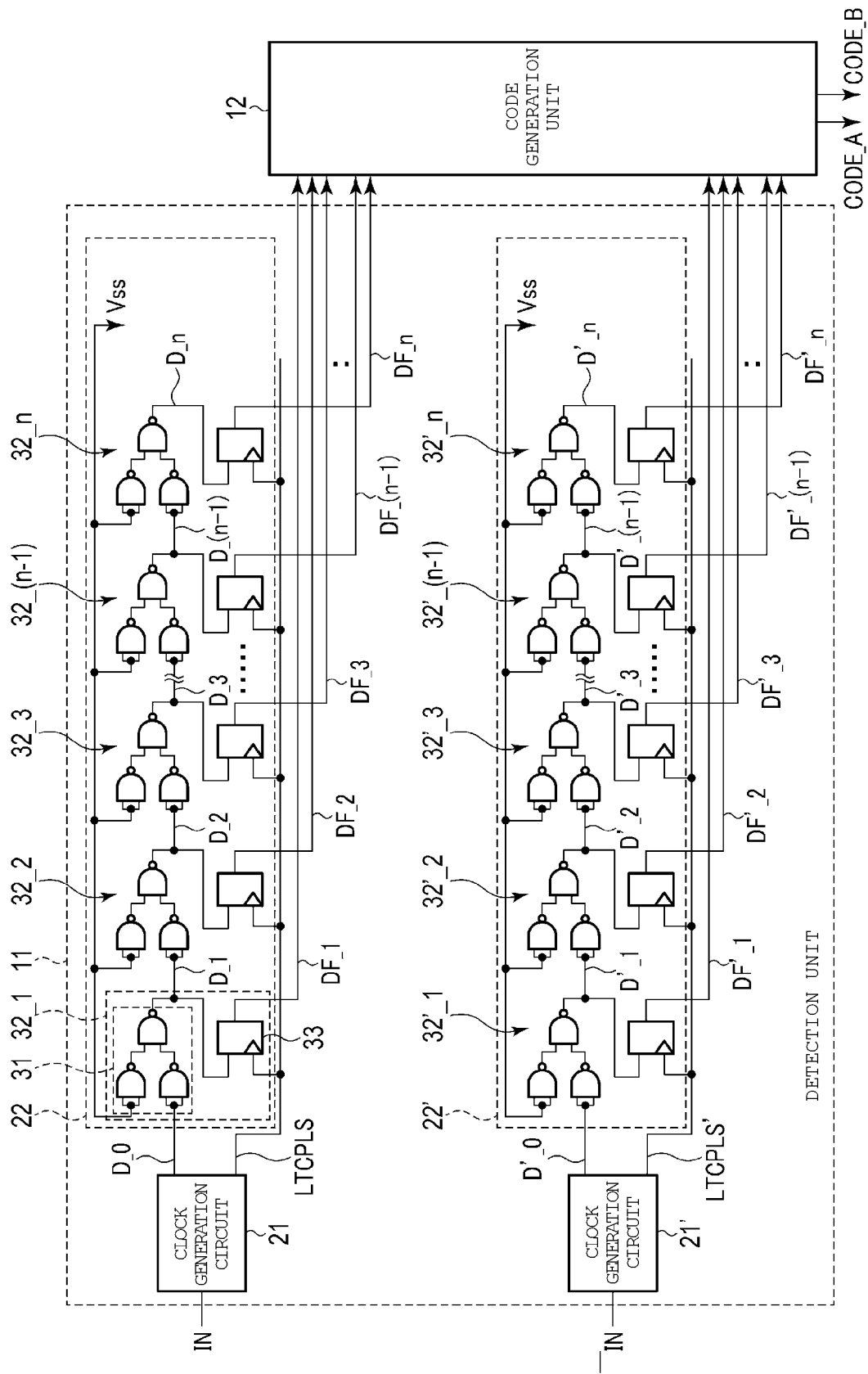
FIG. 3 illustrates an example of details of a detection unit according to the first embodiment.

FIG. 3 illustrates an example of details of the detection unit 11 according to the first embodiment. As illustrated in FIG. 3, the detection unit 11 includes clock generation circuits 21 and 21' and delay lines 22 and 22'.

The clock generation circuit 21 receives the input clock IN and generates the signals D_0 and LTCPLS from the input clock IN. The signal D_0 is a signal obtained by delaying the input clock IN for a certain time. The signal LTCPLS goes to a high level after a high level period of the input clock IN elapses from first rising of the input clock IN. The high level period of the signal LTCPLS is maintained to be the same length as one cycle of input clock IN. Accordingly, the clock generation circuit 21 can generate the signal LTCPLS, for example, by latching the signal D_0 at falling of the input clock IN. The signal D_0 maybe a signal that reproduces the high level period of the input clock IN, and may be the same as the input clock IN.

The delay line 22 receives the signals D_0 and LTCPLS and generates n (n is a natural number of 2 or more) bit signals DF (DF_1 to DF_n) using the signals D_0 and LTCPLS. As described above, a set of signals DF_1 to DF_n indicates a high level period of one cycle (for example, a first one cycle) of the input clock IN.

The delay line 22 can include n delay units 32_1 to 32_$n$. In each case where a (a is a natural number larger than or equal to 1 and smaller than or equal to n) is larger than or equal to 1 and smaller than or equal to n, the delay unit 32_$\alpha$ receives the signal D_($\alpha$-1) and outputs the signal D_$\alpha$. Hereinafter, it is assumed that a notation including "$\alpha$" collectively indicates all the cases where a is a value larger than or equal to 1 and smaller than or equal to n, that is, the notation collectively indicates a case where $\alpha$ is 1, a case where $\alpha$ is 2, . . . , and a case where $\alpha$ is n. The signal D_$\alpha$ is a signal generated by delaying the signal D_($\alpha$-1) by a certain time. The delay unit 32_$\alpha$ receives the signal LTCPLS, holds a logic level of the signal D_$\alpha$ when the signal LTCPLS is shifted to a high level, and continuously outputs the signal DF_$\alpha$ having the same logic level as the held signal D_$\alpha$.

The delay unit 32_$\alpha$ can include delay elements 31 and D flip-flops (hereinafter, simply referred to as flip-flops) 33. The delay element 31 of the delay unit 32_$\alpha$ receives the signal D_($\alpha$-1) and outputs the signal D_$\alpha$. The signal D_$\alpha$ is a signal obtained by delaying the signal D_($\alpha$-1) by time delayed by the delay unit 32_$\alpha$. The delay amount of the delay units 32_1 to 32_$n$ can vary due to unintended variation of performance of the delay units 32_1 to 32_$n$, but means time Td, and it is assumed that the delay amount of the delay units 32_1 to 32_$n$ is the time Td. The delay element 31 of the delay unit 32_$\alpha$ includes, for example, three NAND gates. The first NAND gate receives the signal D_($\alpha$-1) at two input terminals, the second NAND gate has two input terminals that are grounded, that is, connected to a node of a ground potential Vss. The third NAND gate receives an output of the first NAND gate and an output of the second NAND gate, and outputs the signal D_$\alpha$. The delay element 31 of the delay unit 32_$\alpha$ causes a delay of only the time Td of a signal by the delay unit 32_$\alpha$.

The flip-flop 33 of the delay unit 32_$\alpha$ receives the signal D_$\alpha$ at a data input terminal, receives the signal LTCPLS at a clock input terminal, and outputs the signal DF a. The signal DF_$\alpha$ is received by the code generation unit 12.

The clock generation circuit 21' has the same function as the clock generation circuit 21. That is, the clock generation circuit 21' receives the input clock ⁻IN and generates signals D'_1 and LTCPLS' from the input clock ⁻IN. The input clock ⁻IN and the signals D'_0 and LTCPLS' of the clock generation circuit 21' correspond to the input clock IN and the signals D_0 and LTCPLS of the clock generation circuit 21, respectively. Hence, a description in which the input clock IN and the signals D_0 and LTCPLS of the clock generation circuit 21 are replaced with the input clock ⁻IN and the signals D'_0 and LTCPLS', respectively is applied to the clock generation circuit 21'.

A delay line 22' has the same function as the delay line 22. That is, the signal D'_0 and the signal LTCPLS' are received, and the signal D'_0 and the signal LTCPLS' are used to generate n bit signals DF'_(DF'_1 to DF'_n).

The delay line 22' can include n delay units 32'_1 to 32'_n as well as the delay line 22. In the delay line 22', the delay element 31', the delay unit 32'_$\alpha$, and the signals D'_$\alpha$ and DF' a correspond to the delay element 31, the delay unit 32_$\alpha$, and the signals D_$\alpha$ and DF_$\alpha$ of the delay line 22, respectively. Hence, description in which the delay unit 32_$a$ and the signals D_$\alpha$ and DF_$\alpha$ of the delay line 22 are replaced with the delay unit 32'_$\alpha$ and the signals D'_$\alpha$ and DF'_$\alpha$, respectively is applied to the delay line 22'.

The code generation unit 12 generates the code signals CODE_A and CODE_B from the signals DF_1 to DF_n and DF'_1 and DF'_n. Code generation of the code generation unit 12 will be described below.

Figure 4:
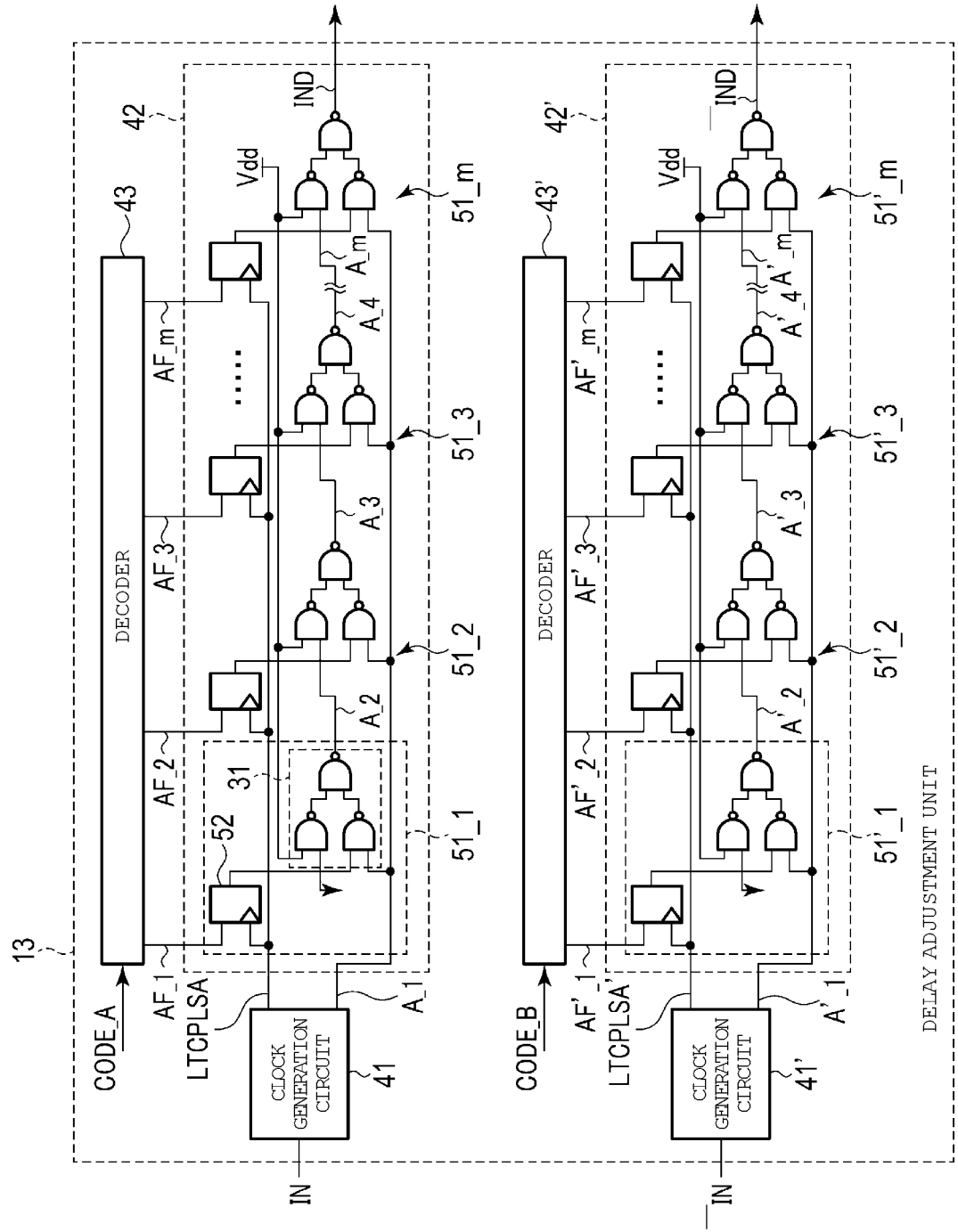
FIG. 4 illustrates an example of details of the delay adjustment unit according to the first embodiment.

FIG. 4 illustrates an example of details of the delay adjustment unit 13 according to the first embodiment. As illustrated in FIG. 4, the delay adjustment unit 13 includes clock generation circuits 41 and 41', delay lines 42 and 42', and decoders 43 and 43'.

The clock generation circuit 41 has the same function as the clock generation circuit 21, receives the input clock IN, and generates signals A_1 and LTCPLSA from the input clock IN. The signal A_1 is a signal obtained by delaying the input clock IN by a certain time, for example, a signal obtained by delaying by the same amount of time as the delay of the signal D_0 for the input clock IN. The signal LTCPLSA is a signal obtained by delaying the input clock IN by time different from the signal A_1.

The delay line 42 receives the signals LTCPLSA and A_1, receives m signals m (m is a natural number of 2 or more) signals AF_1 to AF_m from the decoder 43, delays the signal A_1 by the amount corresponding to the signals AF_1 to AF_m, and outputs the delayed signal as a delay input clock IND.

The delay line 42 can include m delay units 51_1 to 51_$m$. In each case where β (β is a natural number larger than or equal to 1 and smaller than or equal to m) is 1 to m, the delay unit 51_β receives signals A_1, A_β, AF_β, and LTCPLSA. Hereinafter, it is assumed that the notation including "β" collectively indicates all the cases where β is a value larger than or equal to 1 and smaller than or equal to m, that is, the notation collectively indicates a case where β is 1, a case where β is 2, . . . , and a case where β is m. However, the delay unit 51_1 receives a signal fixed to a low level instead of a signal A_β.

The delay unit 51_β holds continuously and internally a signal having the same logic level as a logic level of the signal AF_β when the signal LTCPLSA is shifted to a high level. The delay unit operates by using this internal signal as a selection signal. The delay unit 51_β selects the signal A_1 while the internal selection signal of the delay unit 51_β is in a high level and selects the signal A_β while the internal selection signal of the delay unit 51_β is in a low level. The delay unit 51_β outputs the selected signal as a signal A_(β+1) while delaying the selected signal by the same delay time as the delay time Td delayed by the delay element 31 of the detection unit 11. The delay unit 51_1 outputs a signal A_2 of a low level while the internal selection signal of the delay unit 51_1 is in a low level. A signal A_(m+1) (not illustrated) which is an output signal of the delay unit 51_$m$ is the delay input clock IND. A signal A_(β+1) is a signal obtained by delaying the signal A_β by the same delay time as the delay time Td delayed by the delay element 31 of the detection unit 11.

The delay unit 51_β can include the delay element 31 and a flip-flop 52. The flip-flop 52 of the delay unit 51_β receives the signal LTCPLSA at a clock input terminal and receives the signal AF_β at a data input terminal. The delay element 31 of the delay unit 51_β receives an output of the flip-flop 52 of the delay unit 51_β as an internal selection signal, receives the signal A_β, and outputs the signal A_(β+1). The delay element 31 of the delay unit 51_β outputs a signal obtained by delaying the signal A_1 by the delay time Td as the signal A_β if the internal selection signal (output of the flip-flop 52) of the delay unit 51_β is in a low level, and outputs a signal obtained by delaying the signal A_1 by the delay time Td as the signal A_β if the internal selection signal is in a high level. However, the delay element 31 of the delay unit 51_1 outputs a low level if the internal selection signal of the delay unit 51_1 is in a low level.

The decoder 43 receives the code signal CODE_A and generates the signals AF_1 to AF_m, based on the code signal CODE_A. Specifically, the decoder 43 makes one of the signals AF_1 to AF_m go to a high level during a certain period, based on the code signal CODE_A.

As described above, if the signal AF_β goes to a high level, the delay unit 51_β selects the signal A_1, delays the signal A_1 by the delay time Td delayed by the delay element 31 of the delay unit 51_β, and then outputs the delayed signal as the signal A_(β+1). In each case where γ (γ is a natural number which is not β and is larger than or equal to 1 and smaller than or equal to m) is not β and is 1 to m, the delay unit 51_γ selects a signal A_γ, delays the signal A_γ by the delay time Td delayed by the delay element 31 of the delay unit 51_γ, and then outputs the delayed signal as the signal A_(γ+1). Thus, only one delay unit 51_β is switched to select the signal A_1, and thereby, the delay amount of the delay input clock IND from the signal A_1 is changed. More specifically, if only the delay unit 51_$m$ is switched to select the signal A_1, the delay of the delay input clock IND is the smallest. In a case where only the delay unit 51_$m$ selects the signal A_1, the delay input clock IND does not necessarily have to be delayed from the signal A_1 and the input clock IN, and may be the same as the input clock IN.

In order to increase a delay amount of the delay input clock IND, z is selected as a natural number from 1 to m, the smaller z is selected, and the delay unit 51_z is switched to select the signal A_1. The delay unit 51_z selecting the signal A_1 and the delay units 51(z+1) to 51_$m$ form a signal path between a node of the signal A_1 and a node of the delay input clock IND.

The clock generation circuit 41' has the same function as the clock generation circuit 41. That is, the clock generation circuit 41' receives the input clock ⁻IN and generates the signals A_1' and LTCPLSA' from the input clock ⁻IN. The input clock ⁻IN and the signals A'_1 and LTCPLS' in the clock generation circuit 41' correspond to the input clock IN and the signals A_1 and LTCPLSA in the clock generation circuit 41, respectively. Hence, description in which the input clock IN and the signals A_1 and LTCPLS of the clock generation circuit 41 are replaced with the input clock ⁻IN and the signals A'_1 and LTCPLS', respectively is applied to the clock generation circuit 41'.

The delay line 42' has the same function as the delay line 42. That is, the delay line 42' receives the signals LTCPLSA' and A'_1, receives m signals AF'_1 to AF'_m from the decoder 43, delays the signal A'_1 by the amount corresponding to the signals AF'_1 to AF'_m, and outputs the delayed signal as the delay input clock ⁻IND.

The delay line 42' can include m delay units 51'_1 to 51'_m as well as the delay line 42. The delay unit 51'_β, the signals A'_1, A'_β, AF'_β, and LTCPLSA' in the delay line 42', and the delay input clock ⁻IND correspond to the delay unit 51_β, the signals A_1, A_β, AF_β, and LTCPLSA in the delay line 42, and the delay input clock IND, respectively. Hence, description in which the delay unit 51_β, the signals A_1, A_β, AF_β, and LTCPLSA in the delay line 42, and the delay input clock IND are replaced with the delay unit 51'_β, the signals A'_1, A'_β, AF'_β, and LTCPLSA' in the delay line 42', and the delay input clock ⁻IND, respectively is applied to the delay line 42'.

The decoder 43' has the same function as the decoder 43. That is, the decoder 43' receives the code signal CODE_B and generates signals AF'_1 to AF'_m, based on the code signal CODE_B. The decoder 43' makes one of the signals AF'_1 to AF'_m go to a high level during a certain period, based on the code signal CODE_B.

If the signal AF'_$\beta$ is in a high level, the delay unit 51'_$\beta$ selects the signal A'_1, delays the signal A'_1 by the delay time Td delayed by the delay element 31' of the delay unit 51'_$\beta$, and then outputs the delayed signal as a signal A'_($\beta$+1). In each case where $\gamma$ is not $\beta$ and is 1 to m, the delay unit 51'_$\gamma$ selects a signal A'_$\gamma$, delays the signal A'_$\gamma$ by a delay time Td delayed by the delay element 31 of the delay unit 51'_$\gamma$, and then outputs the delayed signal as a signal A'_($\gamma$+1). Thus, only one delay unit 51'_$\beta$ is switched to select the signal A'_1, and thereby, the delayed amount of the delay input clock $^-$IND from the signal A'_1 is changed. More specifically, if only the delay unit 51'_m is switched to select the signal A'_1, Delay of the delay input clock $^-$IND is the smallest. In a case where only the delay unit 51'_m is switched to select the signal A'_1, the signal $^-$IND does not necessarily have to be delayed from the signal A'_1 and furthermore from the input clock $^-$IN, and may be the same as the input clock IN. In order to increase the delay amount of the delay input clock $^-$IND, the smaller Z is selected and the delay unit 51'_z is switched to select the signal A'_1. The delay units 51'_z selecting the signal A'_1 and the delay units 51'_(z+1) to 51'_m form a signal path between a node of signal A'_1 and a node of the delay input clock $^-$IND.

Figure 5:
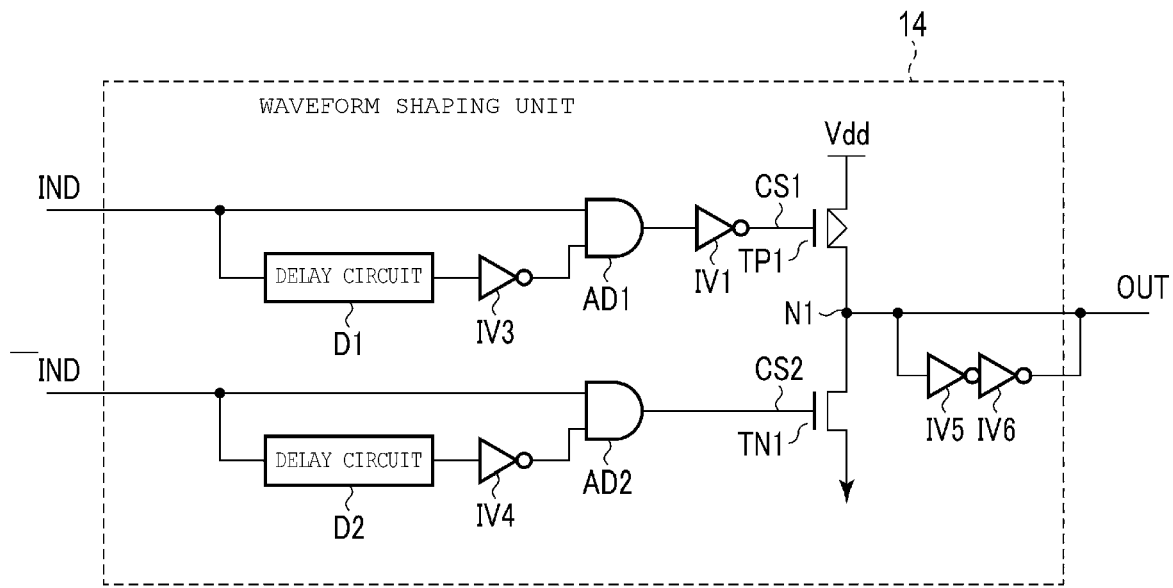
FIG. 5 illustrates an example of details of a waveform shaping unit according to the first embodiment.

FIG. 5 illustrates an example of details of the waveform shaping unit 14 according to the first embodiment. The waveform shaping unit 14 outputs an output clock OUT maintaining a high level for the same period as a period from the rising edge of the delay input clock IND to the rising edge of the delay input clock to $^-$IND. As an example for realizing such an operation, the waveform shaping unit 14 includes inverter circuits IV1, IV3, IV4, IV5, and IV6, delay circuits D1 and D2, AND gates AD1 and AD2, a p-type metal oxide semiconductor field effect transistor (MOSFET) TP1, and an n-type MOSFET TN1.

The delay input clock IND is supplied to a first input terminal of the AND gate AD1 and is supplied to the delay circuit D1. The delay circuit D1 delays the supplied signal for a certain period and outputs the delayed signal. An output of the delay circuit D1 is supplied to the inverter circuit IV3. An output of the inverter circuit IV3 is supplied to a second input terminal of the AND gate AD1. An output of the AND gate AD1 is connected to the inverter circuit IV1. An output signal CS1 of the inverter circuit IV1 is supplied to a gate of the transistor TP1. The transistor TP1 has a first terminal connected to a node Vdd of a power supply potential and has a second terminal connected to a first terminal of the transistor TN1.

The delay input clock $^-$IND is supplied to a first input terminal of the AND gate AD2 and is supplied to the delay circuit D2. The delay circuit D2 delays the supplied signal for a certain period and outputs the delayed signal. An output of the delay circuit D2 is supplied to the inverter circuit IV4. An output of the inverter circuit IV4 is supplied to a second input terminal of the AND gate AD2. An output signal CS2 of the AND gate AD2 is supplied to a gate of the transistor TN1. The transistor TN1 has a second terminal which is grounded.

A node N1 to which the transistors TP1 and TN1 are connected outputs the output clock OUT. The node N1 is also connected to node N1 through the inverter circuits IV5 and IV6 in which even numbered (two in the present example) inverters are series-connected.

A waveform of the signal CS1 has a pulse shape that is maintained in a low level from the falling edge of the delay input clock IND for a certain period shorter than a pulse width of the delay input clock IND by the delay circuit D1, the inverter circuit IV3, the AND gate AD1, and the inverter circuit IV1.

A waveform of the signal CS2 has a pulse shape that is maintained in a high level for a certain period shorter than a pulse width of the delay input clock $^-$IND from rising of the delay input clock $^-$IND by the delay circuit D2, the inverter circuit IV4 and the AND gate AD2.

Figure 6:
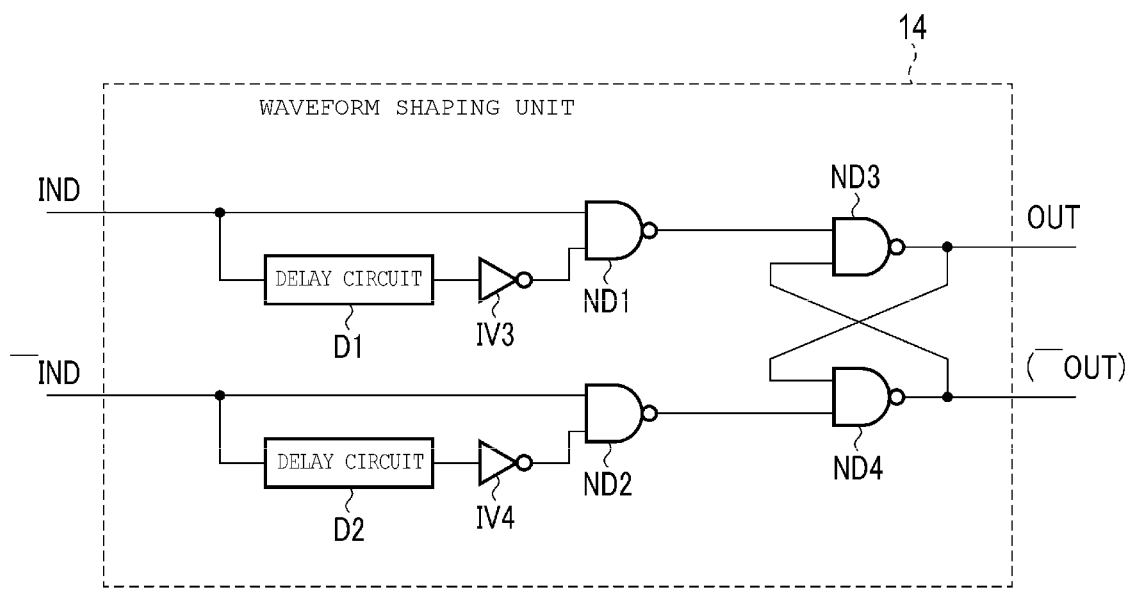
FIG. 6 illustrates another example of the details of the waveform shaping unit according to the first embodiment.

FIG. 6 illustrates another example of the details of the waveform shaping unit 14 according to the first embodiment. As illustrated in FIG. 6, the waveform shaping unit 14 has NAND gates ND1 and ND2 instead of the AND gates AD1 and AD2 and includes NAND gates ND3 and ND4 instead of the inverter circuits IV1, IV5, and IV6 and the transistors TP1 and TN1.

Two inputs of the NAND gate ND1 receive the delay input clock IND and an output of the inverter circuit IV3, respectively. Two inputs of the NAND gate ND2 receive the delay input clock $^-$IND and an output of the inverter circuit IV3, respectively.

The NAND gates ND3 and ND4 configure an RS-type flip-flop. That is, the NAND gate ND3 has a first input terminal receiving an output of the NAND gate ND1 and has an output terminal that outputs the output clock OUT and is connected to a first input terminal of the NAND gate ND4. The NAND gate ND4 has a second input terminal receiving an output of the NAND gate ND2 and has an output terminal connected to a second input terminal of the NAND gate ND3. The NAND gate ND4 outputs an output clock $^-$OUT which is not used in the first embodiment.

1.2. Operation

Figure 7:
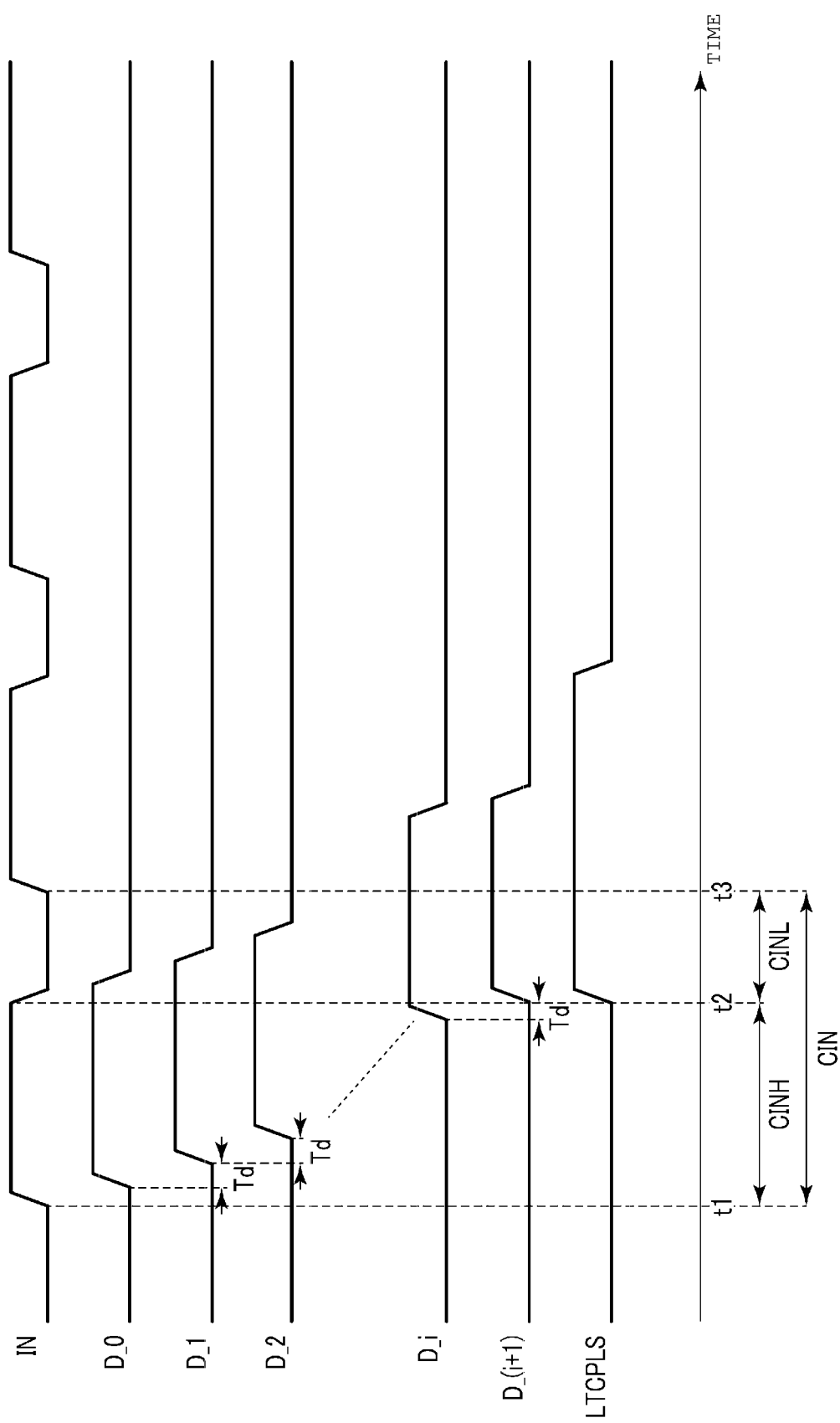
FIG. 7 illustrates several signals along with time during an operation of the detection unit according to the first embodiment along with time.
Figure 8:
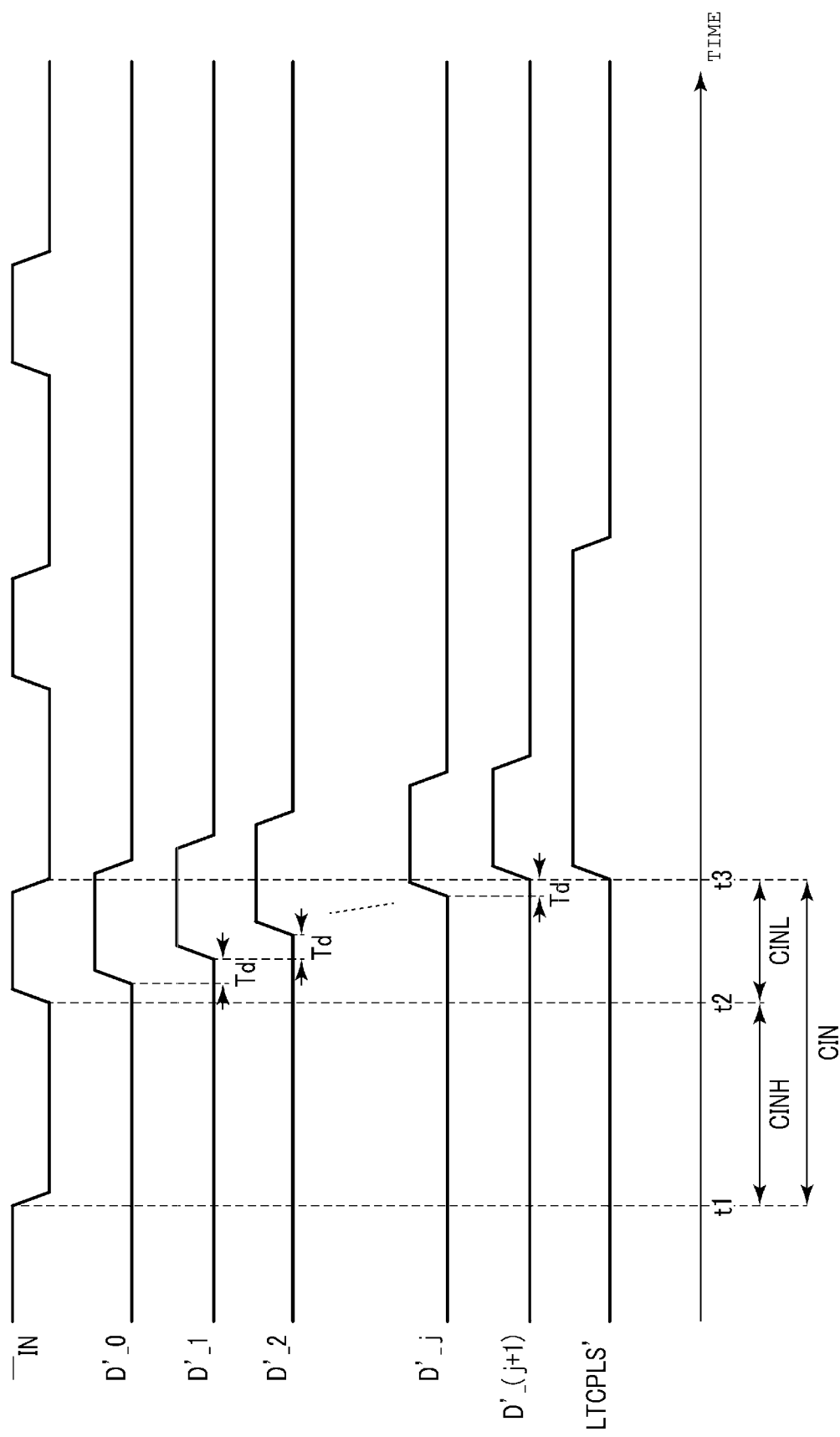
FIG. 8 illustrates the several signals along with time during the operation of the detection unit according to the first embodiment.

FIGS. 7 and 8 illustrate several signals during the operation of the detection unit 11 according to the first embodiment along with time. FIG. 7 illustrates the signals relating to the input clock IN and the delay line 22. Meanwhile, FIG. 8 illustrates the signals relating to input clock $^-$IN and the delay line 22'.

As illustrated in FIG. 7, the input clock IN has a certain duty cycle. For example, the duty cycle is not 50%, and a high level period is longer than a low level period. For the sake of easy understanding, the high level period and the low level period are exaggerated in FIG. 7. The input clock IN has a cycle CIN, is in a high level during a length CINH, and is in a low level during a length CINL.

The input clock IN goes to a high level at time t1 and goes to a low level at time t2. That is, the input clock IN has a pulse shape that maintains a high level from time t1 to time t2. The clock generation circuit 21 outputs a signal generated by delaying a first pulse of the input clock IN by a certain time as a signal D_0. The delay element 31 of the delay unit 32_$\beta$ outputs a signal generated by delaying the signal D_$\beta$ by the time Td as the signal D_($\beta$+1). By doing so, the signals D_1 to D_n sequentially delayed by the time Td in ascending order of values of $\beta$ are obtained. FIG. 7 illustrates only the signal D_1 to a signal D_(i+1) (i is a natural number of n−1 or less).

The clock generation circuit 21 further detects falling of a first pulse of the input clock IN and maintains the signal LTCPLS in a high level during a period having the same length as a period CINH of a high level of the input clock IN from the falling. The flip-flop 33 of the delay unit 32_$\beta$ latches the signal D_$\beta$ in response to a shift of the signal LTCPLS to the high level and outputs the latched signal D_$\beta$ as a signal DF_$\beta$.

FIG. 7 illustrates an example in which the signals D_1 to D_i are in a high level when the signals D_1 to D_n are input to each flip-flop 33 of the delay units 32_1 to 32_n, when the signal LTCPLS shifts to the high level. Thus, the signals D_(i+1) to D_n are in a low level, when the signal LTCPLS shifts to the high level.

The code generation unit 12 counts the number of high-level signals in the signals DF_1 to DF_n. In the present example, the number of high-level signals is i. The number i represents a pulse width (corresponding to a high level period) of the signal D_0, that is, a width of the high level of the input clock IN. Specifically, product of the number i and the delay time Td is equal to the time of the high level of the input clock IN, and thus, the number i represents a width of the high level of the input clock IN in a case where the time Td is used as a unit of time measure.

An operation of the input clock ⁻IN of FIG. ε is the same as the operation of the input clock IN. That is, the input clock ⁻IN has a pulse shape which maintains a high level from the time t2 to the time t3. The clock generation circuit 21' outputs a signal generated by delaying a first pulse of the input clock ⁻IN for a certain period as a signal D'_0. The delay element 31 of the delay unit 32'_β outputs a signal generated by delaying a signal D'_β by the time Td as a signal D'_(β+1). By doing so, the signals D'_1 to D'_n sequentially delayed by the time Td in ascending order of values of β are obtained. FIG. 7 illustrates only the signal D'_1 to a signal D'_(j+1) (j is a natural number of n−1 or less).

The clock generation circuit 21' further detects rising of a first pulse of the input clock ⁻IN and maintains the signal LTCPLS' in a low level during a period having the same length as a period CINL of a high level of the input clock ⁻IN from the rising. The flip-flop 33 of the delay unit 32'_β latches the signal D'_β in response to a shift of the signal LTCPLS' to the high level and outputs the latched signal D'_β as a signal DF'_β.

FIG. 8 illustrates an example in which the signals D'_0 to D'_j are in a high level when the signals D'_0 to D' n are input to each flip-flop 33 of the delay units 32'_1 to 32'_n, when the signal LTCPLS' shifts to the high level. Thus, the signals D'_(j+1) to D' n are in a low level, when the signal LTCPLS' shifts to the high level.

The code generation unit 12' counts the number of high-level signals in the signals DF'_1 to DF'_n. In the present example, the number of high-level signals is j. The number j represents a pulse width (corresponding to a high level period) of the signal D'_0, that is, a width of the high level of the input clock ⁻IN represents the width of the high level of the input clock IN. Specifically, product of the number j and the delay time Td is equal to the time of the high level of the input clock ⁻IN and the time of the low level of the input clock IN, and thus, the number j represents a width of the high level of the input clock ⁻IN and the width of the low level of the input clock IN, in a case where the time Td is used as a unit of time measure.

Figure 9:
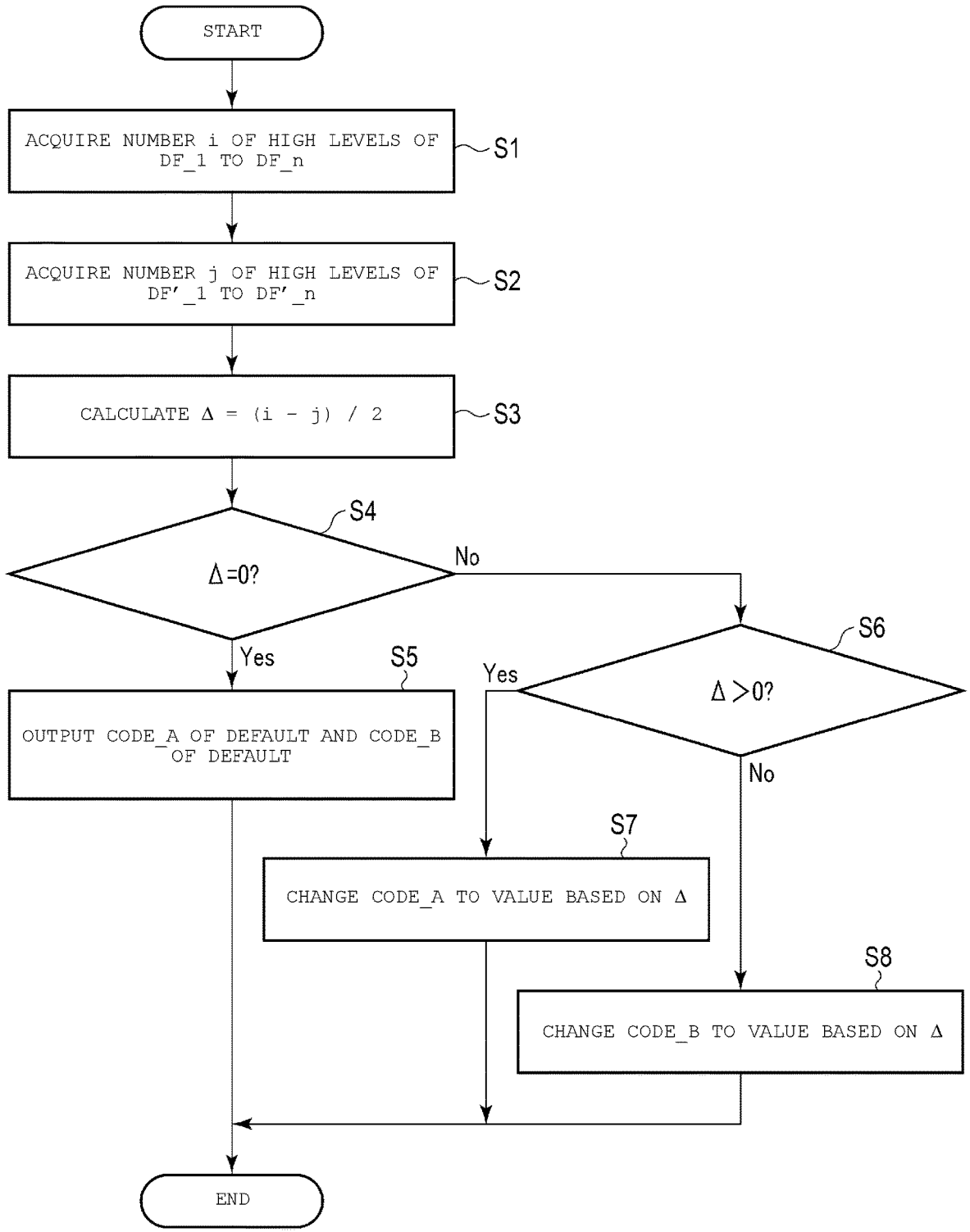
FIG. 9 illustrates a flow of an operation of a code generation unit according to the first embodiment.

FIG. 9 illustrates a flow of the operation of the code generation unit 12 according to the first embodiment. As described above with reference to FIGS. 7 and 8, the detection unit 11 operates according to the detection of the falling of the first pulse of the input clock IN, and thus, if a high-level form of any one of the signals DF_1 to DF_n and the signals DF'_1 to DF'_n is received, the code generation unit 12 starts the flow of FIG. 9.

As illustrated in FIG. 9, in step S1, the code generation unit 12 counts the signals of a high level among the signals DF_1 to DF_n and acquires the number i which is a counting result. In step S2, the code generation unit 12 counts the signals of a high level among the signals DF'_1 to DF'_n and acquires the number j which is a count result.

Figures 10, 11:
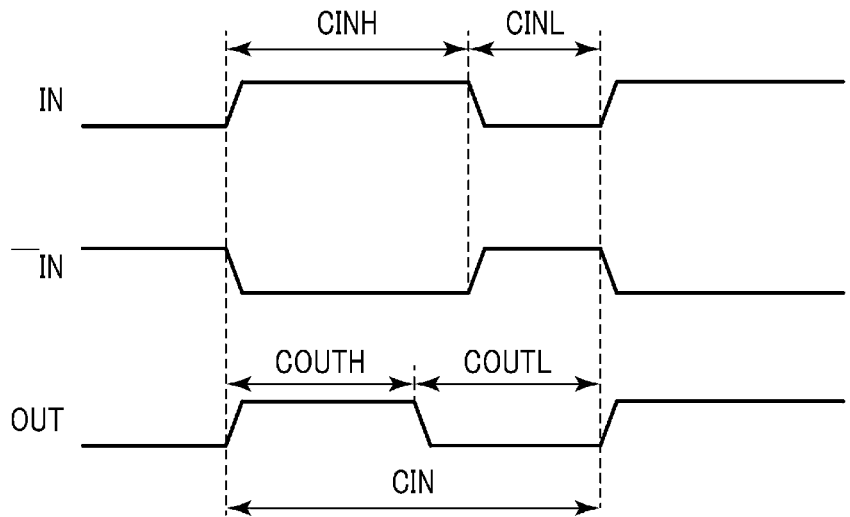
FIG. 10 illustrates an example of an input clock and an output clock of the correction circuit according to the first embodiment.
FIG. 11 illustrates an example of values of a code signal, according to the first embodiment.

In step S3, the code generation unit 12 calculates Δ=(i−j)/2. As described above and illustrated in FIG. 10, the number i indicates a high level period of the input clock IN, and the number j indicates a low level period of the input clock IN. Thus, a difference (i−j) is a difference between the high level period and the low level period of the input clock IN. Δ is equal to a difference between a period TOUTH of a high level (or low level) of a target output clock OUT having the same cycle CIN as the cycle CIN of the input clock IN and having a duty ratio of 50%, and a period CINH (or a period CINL of a low level) of a high level of the input clock IN. FIG. 10 illustrates an example where i and j are different from each other.

Referring back to FIG. 9, in step S4, the code generation unit 12 determines whether or not Δ is 0. In a case where Δ is 0 (Yes branch), the code generation unit 12 outputs the code signal CODE_A of a default value and the code signal CODE_B of the default value, in step S5. The code signal CODE_A of the default value instructs the delay adjustment unit 13 to delay the signal A_1 by a minimum amount. Likewise, the code signal CODE_B of the default value instructs the delay adjustment unit 13 to delay the signal A'_1 by a minimum amount.

In a case where Δ is not zero in step S4 (No branch), the code generation unit 12 determines that Δ is greater than zero in step S6. In a case where Δ is greater than zero (Yes branch), the processing proceeds to step S7. In step S7, the code generation unit 12 changes a value of the code signal CODE_A to a value based on Δ. Specifically, the code signal CODE_A has a value indicating that the signal A_1 is delayed by a period represented by Δ. The code generation unit 12 outputs the changed code signal CODE_A and also outputs the code signal CODE_B of the default value.

In step S5, in a case where Δ is not greater than zero (No branch), the code generation unit 12 changes the value of the code signal CODE_B to a value based on Δ in step S8. The code signal CODE_B has a value indicating that the signal A'_1 is delayed by a period represented by Δ. The code generation unit 12 outputs the changed code signal CODE_B and also outputs the code signal CODE_A of the default value.

FIGS. 11 and 12 illustrate examples of the values of the code signals CODE_A and CODE_B according to the first embodiment, respectively. FIGS. 11 and 12 relate to examples where m is 8. As illustrated in FIG. 11, the code signal CODE_A has three bits. Each value of the code signal CODE_A[3:0] indicates a delay of v×unit time, in a case where a value of the code signal is the value v represented by a decimal number. Each 000 of the code signal CODE_A [3:0] indicates a minimum delay time. The respective values 001, 010, 011, 100, 101, 110, and 111 of the code signal CODE_A[3:0] indicate delays of only the time obtained by multiplying 1, 2, 3, 4, 5, 6, and 7 by unit time, respectively. The unit time is equal to the delay amount delayed by the delay unit 51, that is, equal to the time Td. The values of 0 and 1 of the bits of the signal (for example, the code signal CODE_A) in the present specification appear as a low level and a high level of a digital signal on a signal line transmitting the signal, respectively.

The same applies to the code signal CODE_B. As illustrated in FIG. 12, the code signal CODE_B has three bits. Each value of the code signal CODE_B[3:0] indicates a delay of v×unit time, in a case where a value of the code signal is the value v represented by a decimal number. Each 000 of the code signal CODE_B[3:0] indicates a minimum delay time. The respective values 001, 010, 011, 100, 101, 110, and 111 of the code signal CODE_B[3:0] indicate delays of only the time obtained by multiplying 1, 2, 3, 4, 5, 6, and 7 by unit time, respectively. The unit time is equal to the delay amount delayed by the delay unit 51', that is, equal to the time Td.

FIGS. 13 and 14 illustrate examples of a relationship between code signals and the decoded signals generated by the decoders 43 and 43' according to the first embodiment, respectively. Specifically, FIG. 13 illustrates an example of various valued of the code signal CODE_A and values of the signals AF_1 to AF_m corresponding to the respective values of the code signal CODE_A. FIG. 14 illustrates an example of various values of the code signal CODE_B and values of the signals AF'_1 to AF'_m corresponding to the values of the code signal CODE_B. FIGS. 13 and 14 illustrate examples in which m is 8 in accordance with the example of FIG. 11.

As illustrated in FIG. 13, in a case where the code signal CODE_A[3:0] has 000, 001, 010, 011, 100, 101, 110, and 111, the decoder 43 makes only the signals AF_1, AF_2, AF_3, AF_4, AF_5, AF_6, AF_7, and AF_8 go to a high level, respectively. The other signals are maintained in a low level.

Likewise, in a case where the code signal CODE_B[3:0] has 000, 001, 010, 011, 100, 101, 110, and 111 as illustrated in FIG. 14, the decoder 43' makes only the signals AF'_1, AF'_2, AF'_3, AF'_4, AF'_5, AF'_6, AF'_7, and AF'_8 go to a high level, respectively. The other signals are maintained in a low level.

Figure 15:
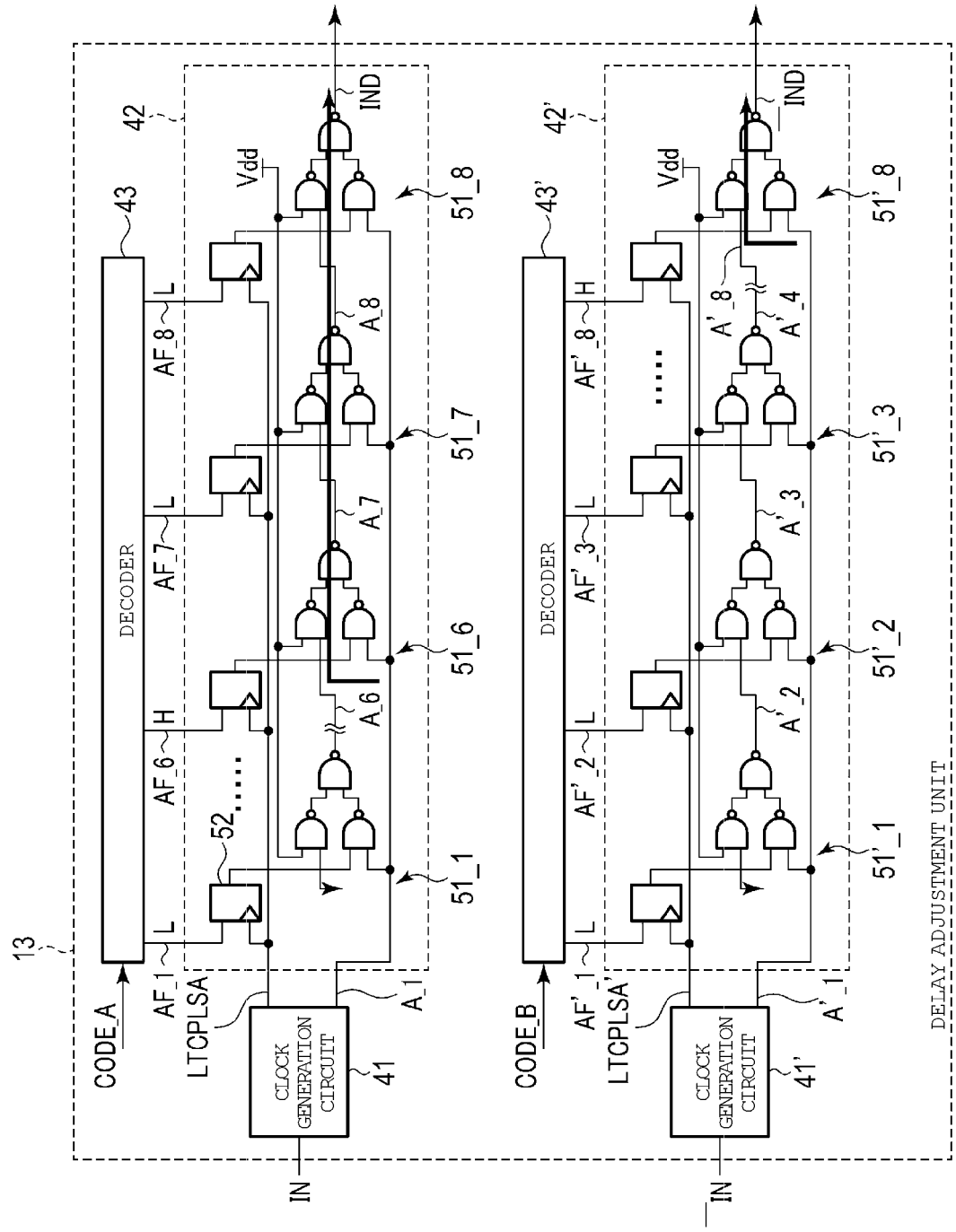
FIG. 15 illustrates an example of a state during an operation of the delay adjustment unit according to the first embodiment.
Figure 16:
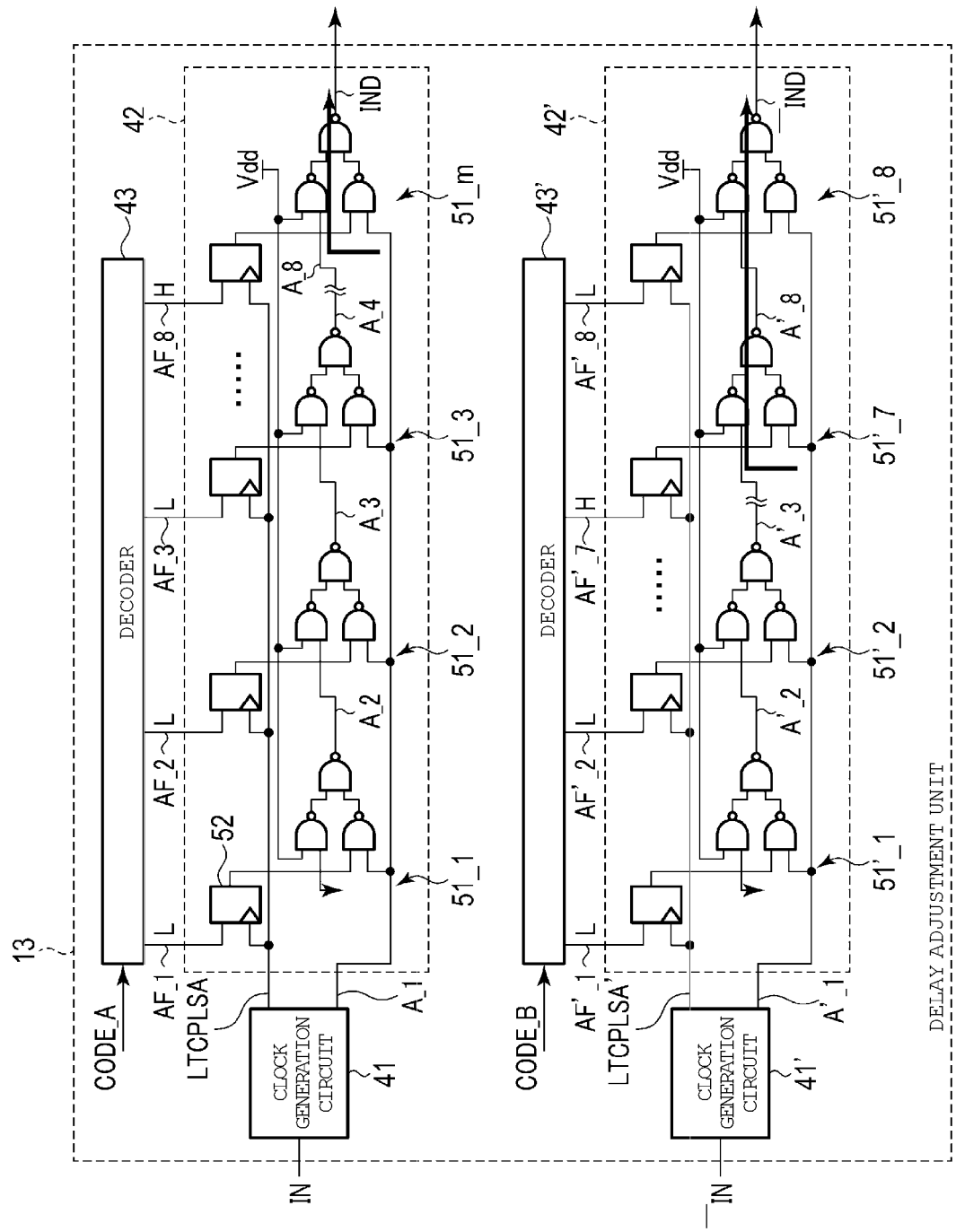
FIG. 16 illustrates an example of another state during the operation of the delay adjustment unit according to the first embodiment.

FIGS. 15 and 16 illustrate examples of states of the delay adjustment unit 13 according to the first embodiment during the operation. Specifically, FIG. 15 illustrates a state in a case where a high level period of the input clock IN is longer than a low level period by four unit time (4×Td). FIG. 16 illustrates a state in a case where a low level period of the input clock IN is longer than a high level period by two unit time (2×Td).

In the example of FIG. 15, Δ is +2. Accordingly, the code signal CODE_A has a value of 010. As a result, the decoder 43 outputs the signal AF_6 of a high level and the signals AF_1 to AF_5 and AF_7 to AF_8 of a low level. Thus, a node of the signal A_1 of the clock generation circuit 41 is connected to a node of the delay input clock IND via the delay units 51_6, 51_7, and 51_8 as denoted by a bold arrow. Thus, the delay input clock IND is a signal obtained by delaying the signal A_1 by unit time in addition to the minimum delay time (that is, delay time of the delay unit 51_8).

Meanwhile, the code signal CODE_B has a default value. Thus, only the signal AF'_8 is in a high level, and a node of the signal A'_1 of the clock generation circuit 41' is connected to a node of the delay input clock to ⁻IND only via the delay unit 51'_8 as denoted by a bold arrow. Thus, the delay input clock ⁻IND is a signal obtained by delaying the signal A'_1 by the minimum delay time (that is, delay time of the delay unit 51'_8).

In the example of FIG. 16, Δ is −1. Accordingly, the code signal CODE_B has a value of 001. As a result, the decoder 43' outputs the signal AF'_7 of a high level and the signals AF'_1 to AF'_6 and AF'_8 of a low level. Thus, a node of the signal A'_1 of the clock generation circuit 41' is connected to a node of the delay input clock to ⁻IND via the delay units 51'_7 and 51'_8 as denoted by a bold arrow. Thus, the delay input clock ⁻IND is a signal obtained by delaying the signal A'_1 by the minimum delay time (that is, delay time of the delay unit 51'_8).

Meanwhile, the code signal CODE_A has a default value. Thus, only the signal AF_8 is in a high level, and a node of the signal A_1 of the clock generation circuit 41 is connected to a node of the delay input clock to IND only via the delay unit 51_8 as denoted by a bold arrow. Thus, the delay input clock IND is a signal obtained by delaying the signal A_1 by the minimum delay time (that is, delay time of the delay unit 51_8).

Figure 17:
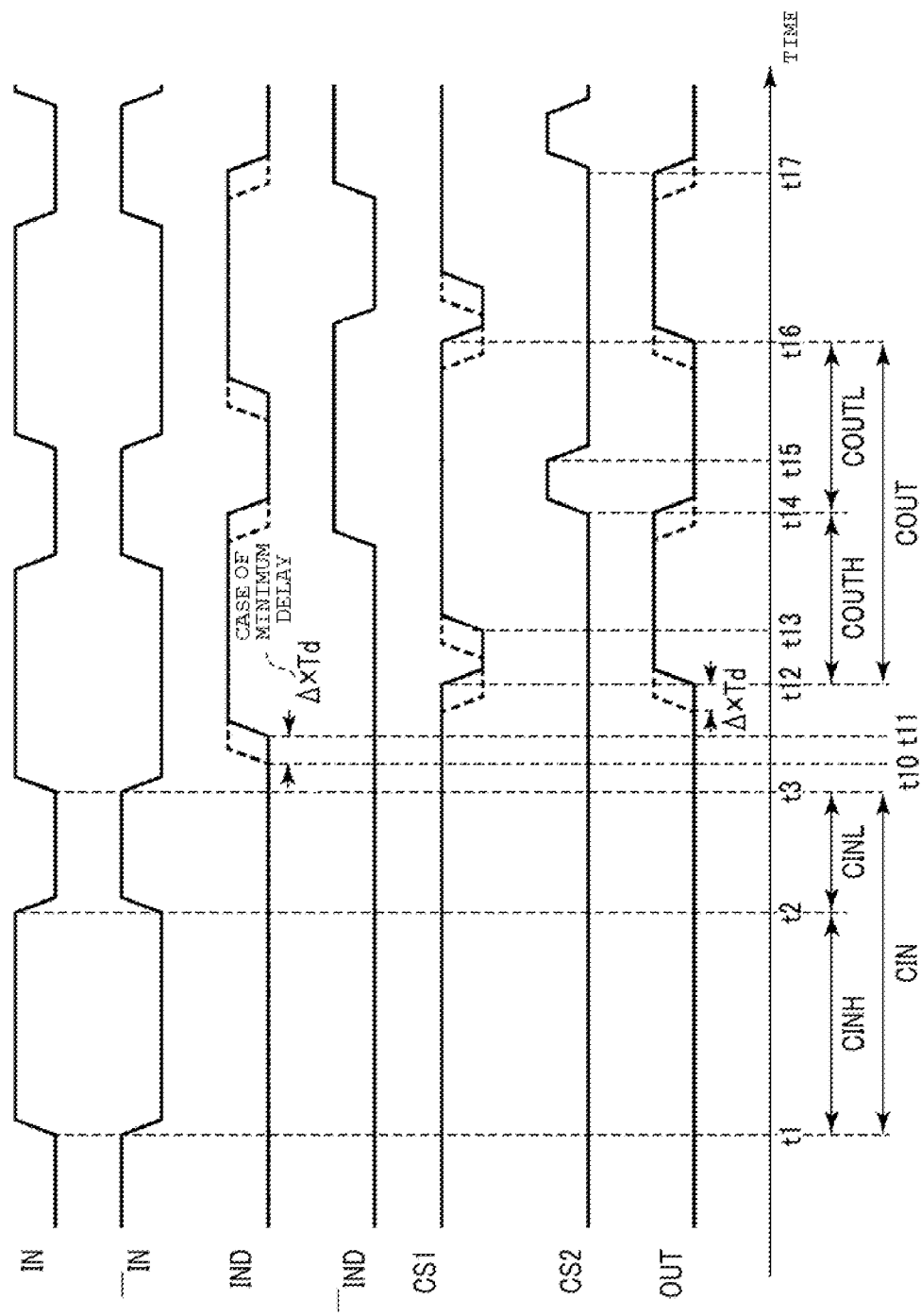
FIG. 17 illustrates several signals of the waveform shaping unit according to the first embodiment along with time.

FIG. 17 illustrates several signals of the waveform shaping unit 14 according to the first embodiment along with time. FIG. 17 also illustrates relevant signals.

First, the input clock IN, the delay input clock IND, the signal CS1, and the output clock OUT will be described.

The high level period CINH of the input clock IN is number i×unit time Td, and the low level period CINL of the input clock IN is number j×unit time Td. Accordingly, the input clock IN (actually the signal A_1) is delayed by the delay line 42 by Δ(=(i−j)/2)×unit time Td. The delay input clock IND rises at time t11 instead of time t10 due to the delay. That is, the delay input clock IND goes to a high level at the time t11 after a period P1 plus the delay time Δ×Td elapses from time t1. The period P1 corresponds to a sum of one cycle (or plural cycles) of the input clock IN and the delay time of the delay unit 51. In a case where the signal A_1 is not delayed, time t10 is reached after a predetermined fixed period elapses from time t1. Dotted lines indicate that the signal A_1 is not delayed (that is, delayed by the minimum delay time).

The signal CS1 falls at time t12 with a certain delay from time t11 due to the components in the waveform shaping unit 14, etc. The transistor TP1 is turned on by the signal CS1 of a low level at time t12 and the output clock OUT goes to a high level. The dotted line indicates the signal A_1 that is not delayed. Thereafter, the delay input clock IND bifurcated to the delay circuit D1 is delayed and goes to a low level, and thereby, the signal CS1 goes to a high level at time t13. However, a level of the output clock OUT at time t13 is maintained by functions of the inverter circuits IV5 and IV6 even after the time t13. Thus, the output clock OUT maintains a high level up to time t14.

As described above, in response to the rising of the input clock IN at time t1, the delay input clock IND rises at time 11, the signal CS1 falls at time t12, and the output clock OUT goes to a high level at time t12. Similarly, when the input clock IN rises again at time t3, the delay input clock IND rises at time y14, and the signal CS1 falls at time 16. As a result, at time t16, the output clock OUT goes to a high level again, and after this time, the output clock OUT goes to a high level at every period equal to a period from the time t12 to the time t16.

Next, the input clock ⁻IN, the delay input clock ⁻IND, the signal CS2, and the output clock OUT will be described.

The delay input clock ⁻IND goes to a high level at the time t12 after a period P2 elapses from the time t2. The period P2 corresponds to a sum of one cycle (or plural cycles) of the input clock IN and the delay time of the delay unit 51'_8, and therefore substantially equals to the period P1. The signal CS2 rises at time t14 with a certain delay from the rise of the delay input clock time ⁻IND t11 due to the components in the waveform shaping unit 14, etc. The transistor TN1 is turned on by the signal CS2 of a high level, and the output clock OUT goes to a low level. Thereafter, the delay input clock ⁻IND bifurcated to the delay circuit D2 is delayed and goes to a low level, and thereby, the signal CS2 goes to a low level at time t15. The level of the output clock OUT at time t15 is maintained by the functions of the inverter circuits IV5 and IV6, and the output clock OUT maintains a low level up to time t16.

As described above, in response to the rising of the input clock ⁻IN at time t2, the delay input clock ⁻IND rises at time 12, the signal CS2 rises at time t14, and the output clock OUT goes to a low level at time t14. Similarly, when the input clock ⁻IN rises again at time 11, the delay input clock ⁻IND reses at t16, and the signal CS2 rises at t17. As a result, at time t17, the output clock OUT goes to a low level again, and after this time, the output clock OUT goes to a low level at every period equal to a period from the time t14 to the time t17.

The output clock OUT has a cycle COUT equal to the period from the time t12 to the time t16, maintains a high level during a period COUTH equal to the period from the time t12 to the time t14, and maintains a low level during a period COUTL equal to the period from the time t14 to the time t16, by the shifts of the high level and the low level of the output clock OUT described above. The period COUTH is delayed by Δ×Td in a case where the shift of the delay input clock IND to a high level is a case where the signal A_1 is not delayed (dotted line), and accordingly, a rising edge of the output clock OUT is delayed by Δ×Td as compared with a case where the signal A_1 is not delayed. As a result, the period COUTH is equal to the period COUTL. That is, the output clock OUT has a duty cycle of 50%.

1.3. Advantage

According to the first embodiment, the correction circuit 1 can output the output clock OUT having a duty cycle of 50% of the input clock IN with high accuracy. Details are as follows.

Figure 18:
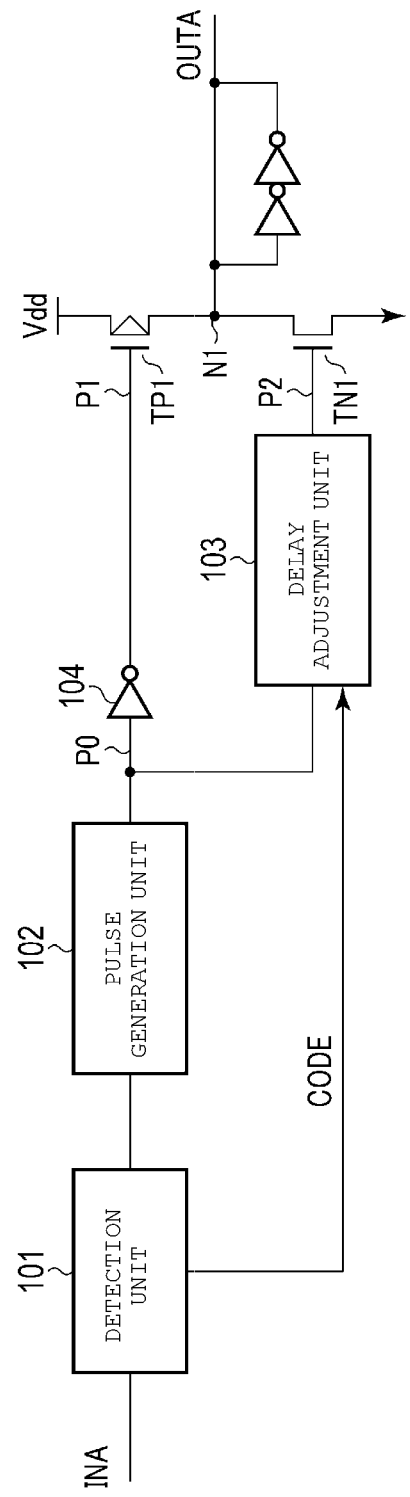
FIG. 18 illustrates a reference correction circuit.

It is considered that a duty cycle of a clock is corrected by using an input clock and a signal obtained by delaying the input clock by a half cycle. FIG. 18 illustrates a circuit for this purpose and FIG. 19 illustrates several signals of the circuit of FIG. 18 along with time.

Figure 19:
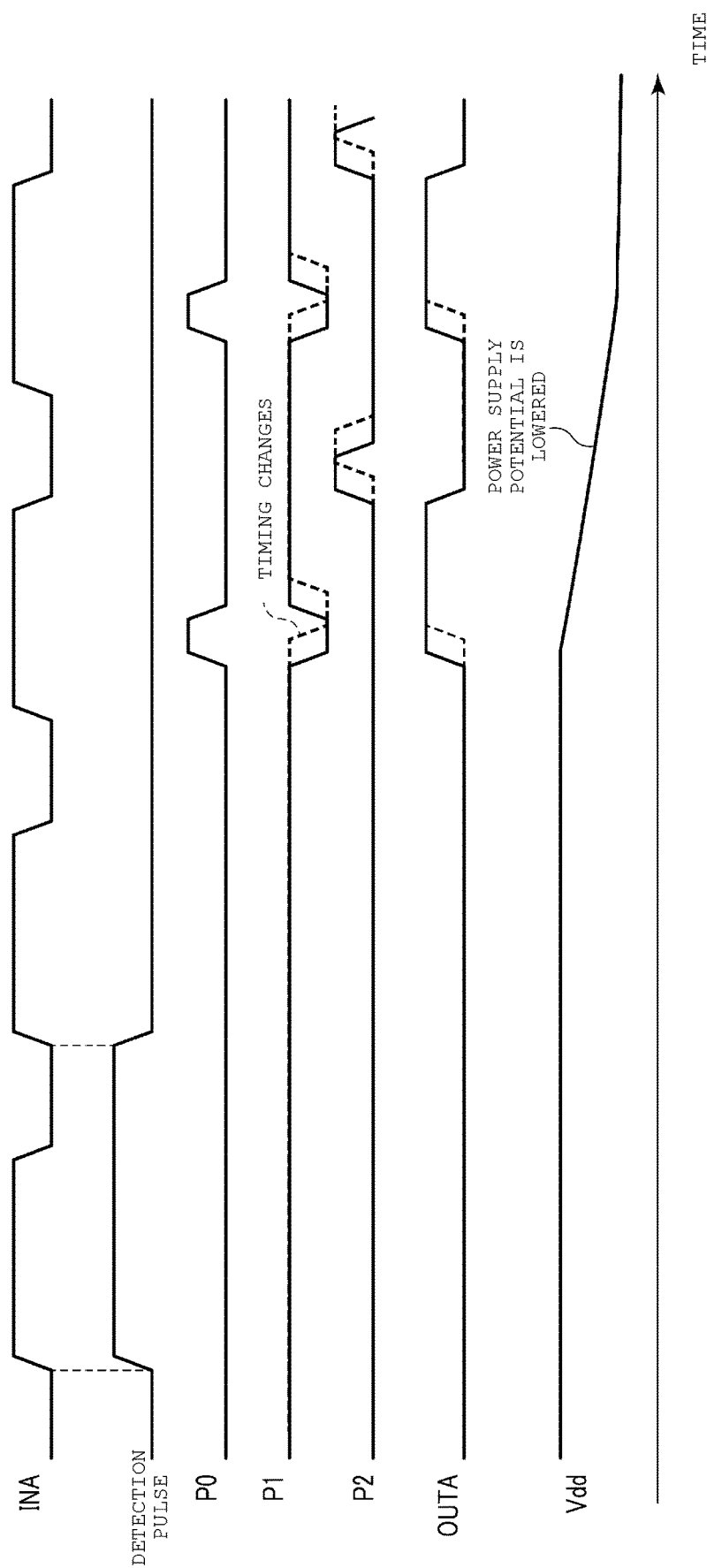
FIG. 19 illustrates several signals of the reference correction circuit along with time.

As illustrated in FIGS. 18 and 19, a detection pulse having a high level period equal to one cycle of an input clock INA is generated by the detection unit 101, and the detection unit 101 detects a length of the detection pulse, that is, a length of one cycle of the input clock INA. The detection unit 101 calculates a length of a half cycle from the length of one cycle of the input clock INA and supplies a code signal CODE relating to the length of the half cycle to a delay adjustment unit 103. A pulse generation unit 102 supplies a pulse signal P0, which falls in synchronization with rising of the input clock INA in the same cycle as the cycle of the input clock INA, to an inverter circuit 104 and the delay adjustment unit 103 from the input clock INA. The inverter circuit 104 supplies a pulse signal P1 of an inverted logic of the pulse signal P0 to the gate of the transistor TP1. The delay adjustment unit 103 generates a pulse signal P2 that rises from falling of the pulse signal P0 every time a period equal to a half cycle of the input clock INA elapses, based on the code signal CODE. The pulse signal P2 is supplied to the gate of the transistor TN1. With such a circuit, an output clock OUTA is expected to have a duty cycle of 50% in the same period as the input clock INA.

The detection unit 101 and the delay adjustment unit 103 also include the same elements and connections as the delay line 22 (or 22') of the detection unit 11, and also include many delay units that can be selectively connected in series. In order to detect a length of one cycle of the input clock INA, the detection unit 101 includes a very large number of delay units, which can be selectively connected in series, more than or equal to the number obtained by dividing the length of one cycle by a delay time (corresponding to the time Td in the first embodiment) delayed by the delay unit. The delay adjustment unit 103 also includes very large number of delay units that can be selectively connected in series, in order to cause a delay of a half cycle of the input clock INA. A delay in the detection unit 101 and a delay in the delay adjustment unit 103 are required to be approximately the same accuracy, for example, in a case where a certain signal is delayed by 180 degrees, signals with the same degree of delay are required to be able to output. Accordingly, the delay of the delay unit in the detection unit 101 and the delay of the delay unit in the delay adjustment unit 103 need to have no large variation. However, the delay unit mutually inevitably have variations in performance. The variation in the performance of the delay unit becomes more significant as more delay units are required. Accordingly, accuracy of the delay amount of the detection unit 101 and accuracy of the delay amount of the delay adjustment unit 103 can be greatly different from each other. This degrades adjustment accuracy of a duty cycle.

In addition, if a value of the power supply potential Vdd varies while a signal is delayed by a delay unit, the delay amount varies unintentionally, as illustrated in FIG. 19. As a result, rising and falling of the pulse signals P1 and (or) P2 can vary from a case where the power supply potential is not changed, as denoted by dotted lines in FIG. 19. This degrades the adjustment accuracy of the duty cycle. In particular, the larger the number of delay units that can be connected in series, the more the change in a power supply displacement can greatly affect the delay amount.

The correction circuit 1 according to the first embodiment detects (measures) the high level period of the input clock IN and the high level period of the input clock ⁻IN, delays a signal based on the input clock IN or ⁻IN by an amount corresponding to a difference between the detected periods, that is, by the amount of deviation from the duty cycle of 50% of the input clock IN, and generates the signals CS1 and CS2 that controls falling and rising of the output clock OUT. The duty cycle of the input clock IN is defined by, for example, a specification and (or) a standard, is often not greatly deviated from 50%, and is often not greatly different between the high level period and the low level period. Thus, the delay amount required for generating the signals CS1 and CS2 is small, and, for example, there is no need to delay the input clock IN even by a half period as in the example of FIGS. 18 and 19. Accordingly, the delay adjustment unit 13 does not require fewer delay units 51 and 51' and needs to include simply the delay units 51 and 51' of the number for delaying deviation of the maximum X %, for example, in a case where deviation from the duty cycle of 50% of the input clock IN becomes maximum X % by a standard. Thus, even if there is performance variation among the delay units 51, 51', 32, and 32', it is possible to prevent accuracy of the delay in the detection unit 11 and accuracy of the delay in the delay adjustment unit 13 from being greatly different from each other. This is illustrated in FIG. 20.

Figure 20:
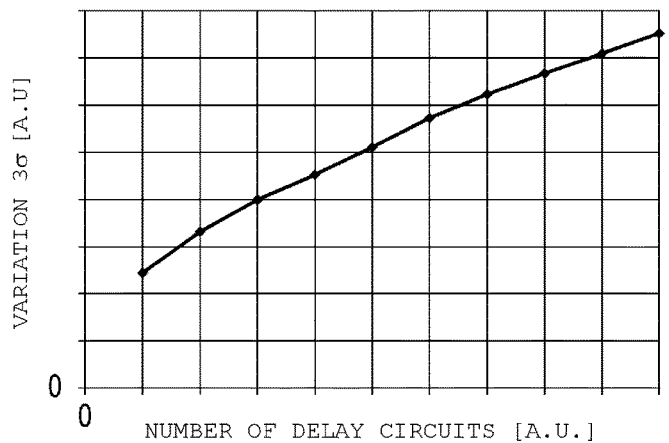
FIG. 20 illustrates a relationship between the number of series-connected delay circuits and a variation of delay time.

FIG. 20 illustrates variation in the number of series-connected delay circuits, such as the delay units 32, 32', 51, and 51', and variation in the delay amount from an input to an output of a set of the series-connected delay circuits. FIG. 20 illustrates that the larger the number of series-connected delay circuits is, the more the variations in the delay amounts of the delay circuits are integrated, and the variation in the delay amount from the input to the output of the set of the series-connected delay circuits increases.

In addition, since the delay amount in the delay adjustment unit 13 is reduced, it is possible to prevent adjustment accuracy of the duty cycle due to fluctuation of the power supply potential from degrading.

Furthermore, according to the first embodiment, the duty cycle of the input clock IN, more accurately, the deviation from the duty cycle of 50% can be detected without waiting for one cycle of the input clock IN, unlike a case of the examples of FIGS. 18 and 19. Accordingly, the time, which is required for correcting the duty cycle, from the start of the detection of the duty cycle to the completion of the detection is shorter than a case of the examples of FIGS. 18 and 19. This brings the following advantages.

In general, a duty correction circuit such as the correction circuit 1 detects a duty cycle of an input clock from a first pulse of the input clock for the purpose of rapidly obtaining an output clock from an input of the input clock in many cases. However, a controller controlling the semiconductor device 2 may perform an unstable operation due to an unstable power supply potential or the like, shortly after the operation starts. In this case, the input clock shortly after the start of the operation may have a waveform corrupted from a waveform in a state where a state of the controller is stable. In this case, the output clock generated by using the first input clock may not have the desired waveform and may not use the first pulse. Even in this case, according to the first embodiment, detecting the duty cycle can be completed in a shorter time than in a case of the examples of FIGS. 18 and 19, and thus, the output clock is obtained earlier than in a case of the examples of FIGS. 18 and 19.

Second Embodiment

A second embodiment is different from the first embodiment in respect of a detection unit 16 and a code generation unit 17.

2.1. Structure

Figure 21:
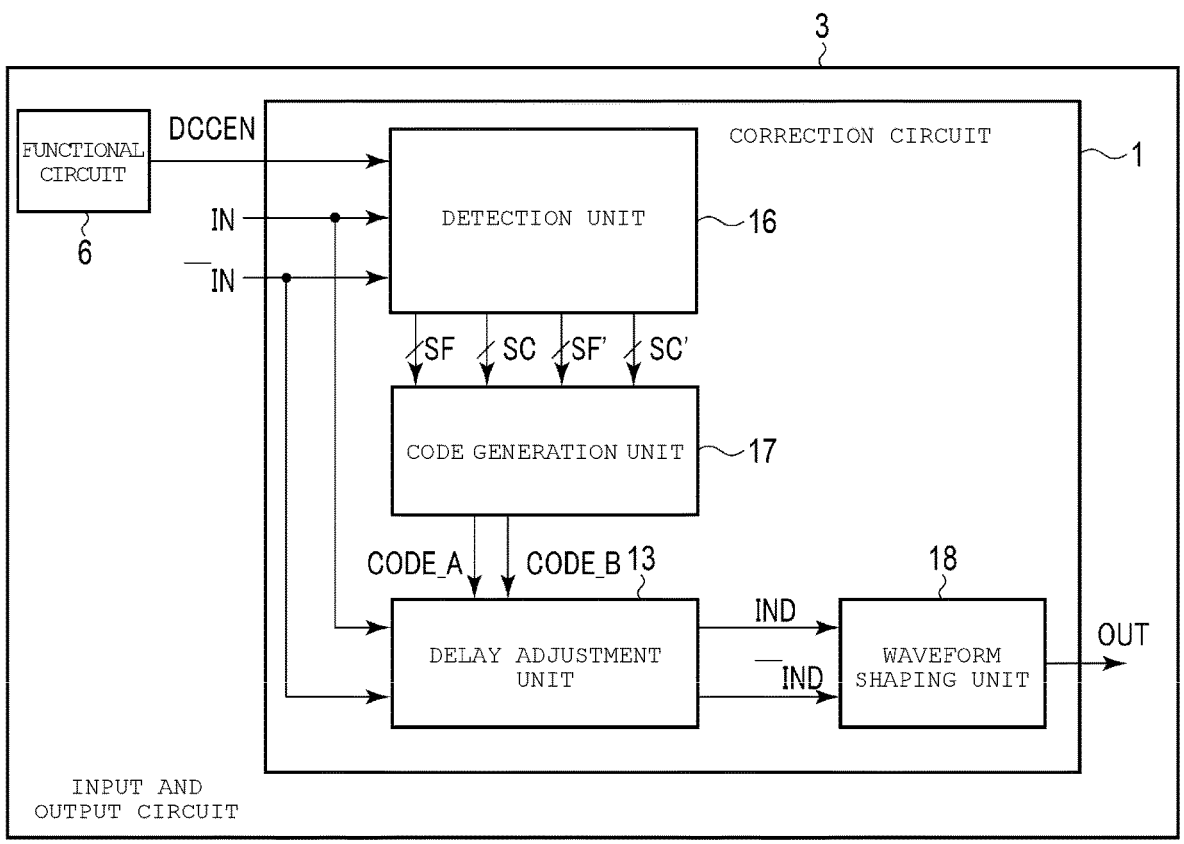
FIG. 21 illustrates a functional block of a correction circuit according to a second embodiment.

FIG. 21 illustrates a functional block and a related functional block of the correction circuit 1 according to the second embodiment. The correction circuit 1 according to the second embodiment includes the detection unit 16, the code generation unit 17, and a waveform shaping unit 18 instead of the detection unit 11, the code generation unit 12, and the delay adjustment unit 13 according to the first embodiment, respectively.

The detection unit 16 detects (measures) a pulse width of the input clock IN and a pulse width of the input clock ⁻IN in the same manner as the detection unit 11. The detection unit 16 receives an enable signal DCCEN from a functional circuit 6. The functional circuit 6 may be provided in an input and output circuit 3 or may be provided outside the input and output circuit 3.

The detection unit 16 operates while receiving the asserted enable signal DCCEN. The detection unit 16 detects the pulse width of the input clock IN and the pulse width of the input clock IN and outputs a signal SF of a plurality of bits, a signal SC of a plurality of bits, a signal SF' of a plurality of bits, and a signal SC' of a plurality of bits. A set of the signals SF and SC indicates the pulse width of the input clock IN, based on the input clock IN. A set of the signals SF' and SC' indicates the pulse width of the input clock ⁻IN, based on the input clock ⁻IN.

The code generation unit 17 receives the signals SF, SC, SF', and SC' and compares the pulse width of the input clock IN indicated by the signals SC and SF with the pulse width of the input clock ⁻IN indicated by the signals SC' and SF'.

The code generation unit 12 generates the code signal CODE_A and the code signal CODE_B, based on the comparison result.

The waveform shaping unit 18 has the elements and the connections illustrated in FIG. 6.

Figure 22:
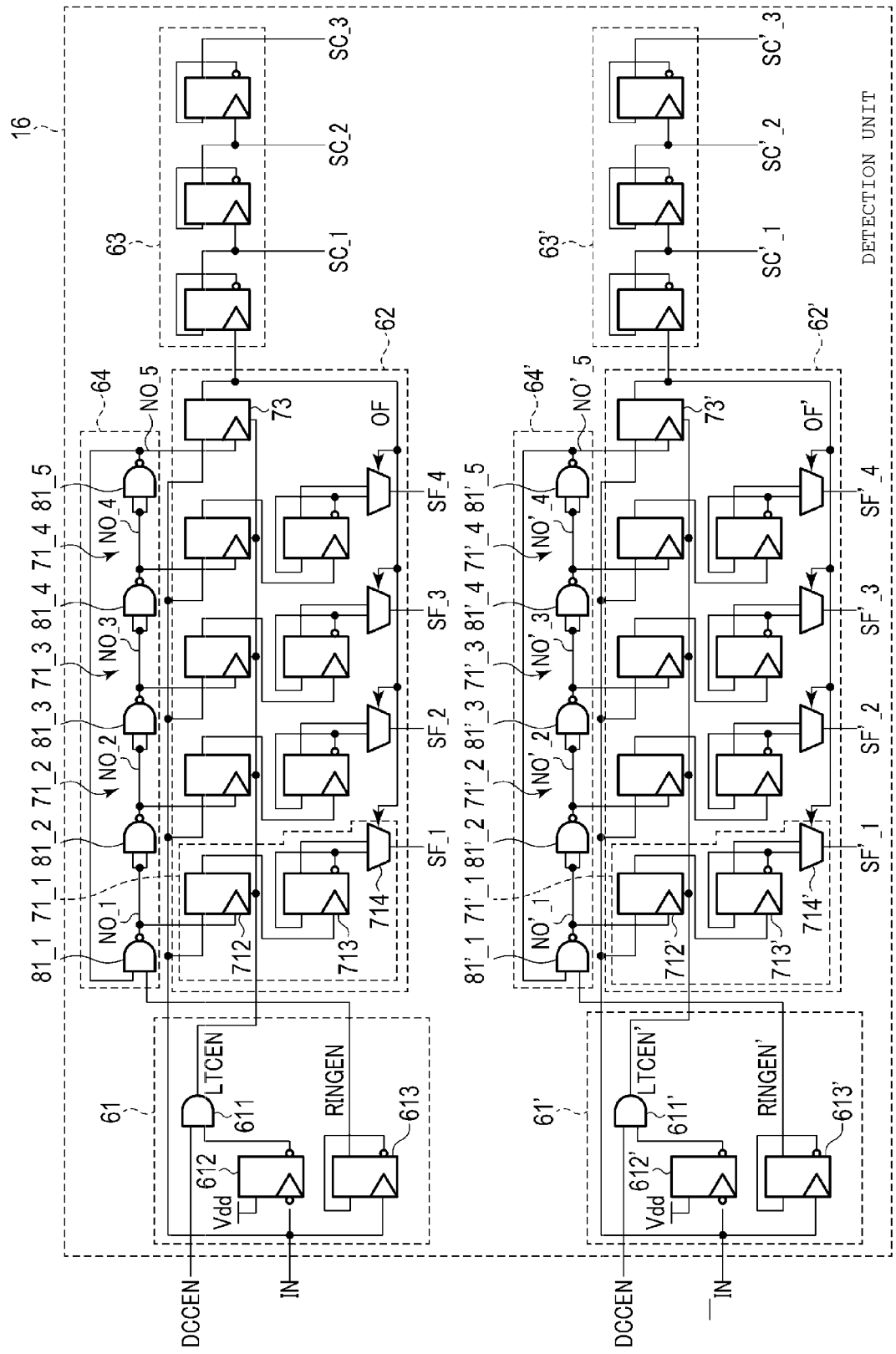
FIG. 22 illustrates an example of details of a detection unit according to the second embodiment.

FIG. 22 illustrates an example of details of the detection unit 16 according to the second embodiment. As illustrated in FIG. 22, the detection unit 16 includes enable circuits 61 and 61', fine code detection units 62 and 62', course code detection units 63 and 63', and ring oscillators 64 and 64'.

The enable circuit 61 generates signals RINGEN and LTCEN, based on the enable signal DCCEN and the input clock IN. The signal RINGEN controls enablement of the ring oscillator 64. The signal LTCEN controls an operation of the fine code detector unit 62.

The signal RINGEN detects one cycle (for example, the first one cycle) of the input clock IN, rises in response to the start (rising of the input clock IN) of the detected one cycle, and falls in response to the end of the detected one cycle (falling of the input clock IN).

The signal LTCEN rises in response to the rising of the enable signal DCCEN and falls in response to the end (falling) the input clock IN of a high level of one cycle (for example, the first one cycle) which is a target of generation of the signal RINGEN.

As an example, the enable circuit 61 includes an AND gate 611 and flip-flops 612 and 613. The input clock IN is supplied to a clock input terminal of the flip-flop 613. The flip-flop 613 outputs the signal RINGEN at an output terminal thereof and receives an inverted output at a data input terminal thereof. The input clock IN is also received at a clock input terminal of the flip-flop 612. The flip-flop 612 operates at falling of the clock input, has an input terminal connected to a node of the power supply potential Vdd, and supplies an inverted output to the AND gate 611. The AND gate further receives the enable signal DCCEN and outputs the signal LTCEN.

The ring oscillator 64 includes s (s is an odd-numbered natural number) NAND gates 81_1 to 81_s. s is, for example, 5, and the following description is based on this example. The NAND gate 81_1 receives the signal RINGEN. The NAND gate 81_8 outputs a signal NO_ε in each case where ε (ε is a natural number smaller than or equal to s (=5)) is 1 to 5. Hereinafter, it is assumed that a notation including "ε" collectively indicates all the cases where ε is a value larger than or equal to 1 and smaller than or equal to s (=5), that is, the notation collectively indicates a case where ε is 1, a case where ε is 2, . . . , and a case where ε is s (=5). In each case where ζ (ζ is a natural number smaller than or equal to s−1 (=4)) is 1 to 4, an output signal NO_ζ of the NAND gate 81_ζ is received by two input terminals of the NAND gate 81_(ζ+1). An output signal NO_5 of the NAND gate 81_5 is received by the other input terminal of the NAND gate 81_1. Hereinafter, it is assumed that a notation including "ζ" collectively indicates all the cases where ζ is a value larger than or equal to 1 and smaller than or equal to s−1 (=4), that is, the notation collectively indicates a case where ζ is 1, a case where ζ is 2, . . . , and a case where ζ is s−1 (=4).

The fine code detection unit 62 receives the input clock IN, the signals NO_0 to NO_5 of the ring oscillator 64, and the signal LTCEN and generates the signal SF, based on the input clock IN and the signals NO_0 to NO_5 and LTCEN. The signal SF is a part of information indicating a high level period of the signal LTCEN, and, for example, every time the high level period of the signal LTCEN lapses for a certain time (delay time of each of the NAND gates 81_1 to 81_5), one bit having data 0 of the signal SF becomes data 1.

The fine code detection unit 62 can include (s−1) signal generation units 71_1 to 71_4 and a flip-flop 73. The signal generation unit 71_ζ receives an output signal NO_ζ of the NAND gate 81_ζ, the signal LTCEN, and the input clock IN, and outputs a signal SF C. The flip-flop 73 receives the input clock IN at a data input terminal thereof, receives the signal LTCEN at a reset input terminal thereof, and receives the signal NO_5 at a clock input terminal thereof.

Each signal generation unit 71 (each of 71_1 to 71_4) can include flip-flops 712 and 713 and a selector 714. The flip-flop 712 of each signal generation unit 71 receives the input clock IN at a data input terminal thereof, receives the output signal NO_ζ of the NAND gate 81_ζ at a clock input terminal thereof, and receives the signal LTCEN at a reset input terminal thereof. An output of the flip-flop 712 of the signal generation unit 71 ζ is received at a clock input terminal of the flip-flop 713 of the signal generation unit 71_ζ, and an output and an inverted output of the flip-flop 713 are received by the selector 714 of the signal generation unit 71_ζ. The inverted output of the flip-flop 713 of the signal generation unit 71_ζ is received at a data input terminal thereof. The selector of the signal generation unit 71_ζ outputs the signal SF_ζ.

An output signal OF of the flip-flop 73 is supplied to the respective selectors 714 of the signal generation units 71_1, 71_2, 71_3, and 71_4. The selector of the signal generation unit 71_ζ outputs the output or the inverted output of the flip-flop 713 of the signal generation unit 71_ζ as the signal SF_ζ depending on whether the output signal OF is in a low level or a high level.

The course code detection unit 63 counts rising of the output signal OF of the flip-flop 73 and illustrates the counting result as the signals SC_1, SC_2, and SC_3. The course code detection unit 63 illustrates the counting result as a 3-bit signal and represents a first bit, a second bit, and a third bit from the least significant bit of the 3 bits as the signals SC_1, SC_2, and SC_3.

The enable circuit 61' has the same function as the enable circuit 61. That is, the enable circuit 61' generates signals RINGEN' and LTCEN', based on the enable signal DCCEN and the input clock ⁻IN. The input clock ⁻IN and the signals LTCEN' and RINGEN' of the enable circuit 61' correspond to the input clock IN and the signals RINGEN and the LTCEN of the enable circuit 61, respectively. Hence, description in which the input clock IN and the signals RINGEN and LTCEN of the enable circuit 61 are replaced with the input clock ⁻IN and the signals RINGEN' and LTCEN', respectively is applied to the enable circuit 61'.

The enable circuit 61' can include an AND gate 611' and flip-flops 612' and 613' in the same manner as the enable circuit 61. The AND gate 611' and the flip-flops 612' and 613' in the enable circuit 61' correspond to the AND gate 611 and the flip-flops 612 and 613 in the inverter circuit 61, respectively. Hence, description in which the AND gate 611 and the flip-flops 612 and 613 are replaced with the AND gate 611' and the flip-flops 612' and 613', respectively is applied to the enable circuit 61'.

The ring oscillator 64' has the same function as the ring oscillator 64. That is, the ring oscillator 64' can include s series-connected NAND gates, each having two input terminals connected to each other, in the same manner as the ring oscillator 64. The NAND gate 81'_ε outputs a signal NO'_ε. An output signal NO'_ζ of the NAND gate 81'_ζ is received by two input terminals of the NAND gate 81'_(ζ+1). The output signal NO_5 of the NAND gate 81'_5 is received by the other input terminal of the NAND gate 81'_1.

The fine code detection unit 62' has the same function as the fine code detection unit 62. That is, the fine code detection unit 62' receives the input clock ⁻IN, the signals NO'_0 to NO'_5 of the ring oscillator 64, and the signal LTCEN' and generates the signal SF', based on the input clock ⁻IN and the signals NO'_0 to NO'_5 and LTCEN'.

The fine code detection unit 62' can include (s−1) signal generation units 71_1 to 71_4 and the Flip-flop 73 in the same manner as the fine code detection unit 62. The input clock IN and the signals LTCEN', SF'_ζ, OF', and NO'_ε of the fine code detection unit 62' correspond to the input clock ⁻IN and the signals LTCEN, SF_ζ, OF, and NO_ε of the fine code detection unit 62, respectively, in the fine code detector unit 62. Hence, description in which the input clock IN and the signals LTCEN, SF_ζ, OF, and NO_ε of the fine code detection unit 62 are replaced with the input clock ⁻IN and the signals LTCEN', SF'_ζ, OF', and NO'_ε, respectively is applied to the fine code detection unit 62'.

Each of the signal generation units 71'_(71'_1 to 71'_4) can include flip-flops 712' and 713' and a selector 714' in the same manner as the signal generation unit 71. The flip-flops 712' and 713' and the selector 714' of a signal generation unit 71'_ζ correspond to the flip-flops 712 and 713 and the selector 714 of the signal generation unit 71_ζ respectively. Hence, description in which the signal generation unit 71_ζ, the flip-flop 73, the flip-flops 712 and 713, the selector 714, the input clock IN, the signals NO_ζ, LTCEN, and the signal SF_ζ are replaced with the signal generation unit 71'_ζ, the flip-flop 73', the flip-flops 712' and 713', the selector 714', the input clock ⁻IN, the signals NO'_ζ, LTCEN', and the signal SF'_ζ, respectively is applied to the fine code detection unit 62'.

The course code detection unit 63' has the same function as the course code detection unit 63. That is, the course code detection unit 63' counts rising of the output signal OF' of the flip-flop 73' and illustrates the counting result as signals SC'_1, SC'_2, and SC'_3. The course code detection unit 63' illustrates the counting result as a 3-bit signal and represents a first bit, a second bit, and a third bit from the least significant bit of the 3 bits as the signals SC'_1, SC'_2, and SC'_3.

2.2. Operation

Figure 23:
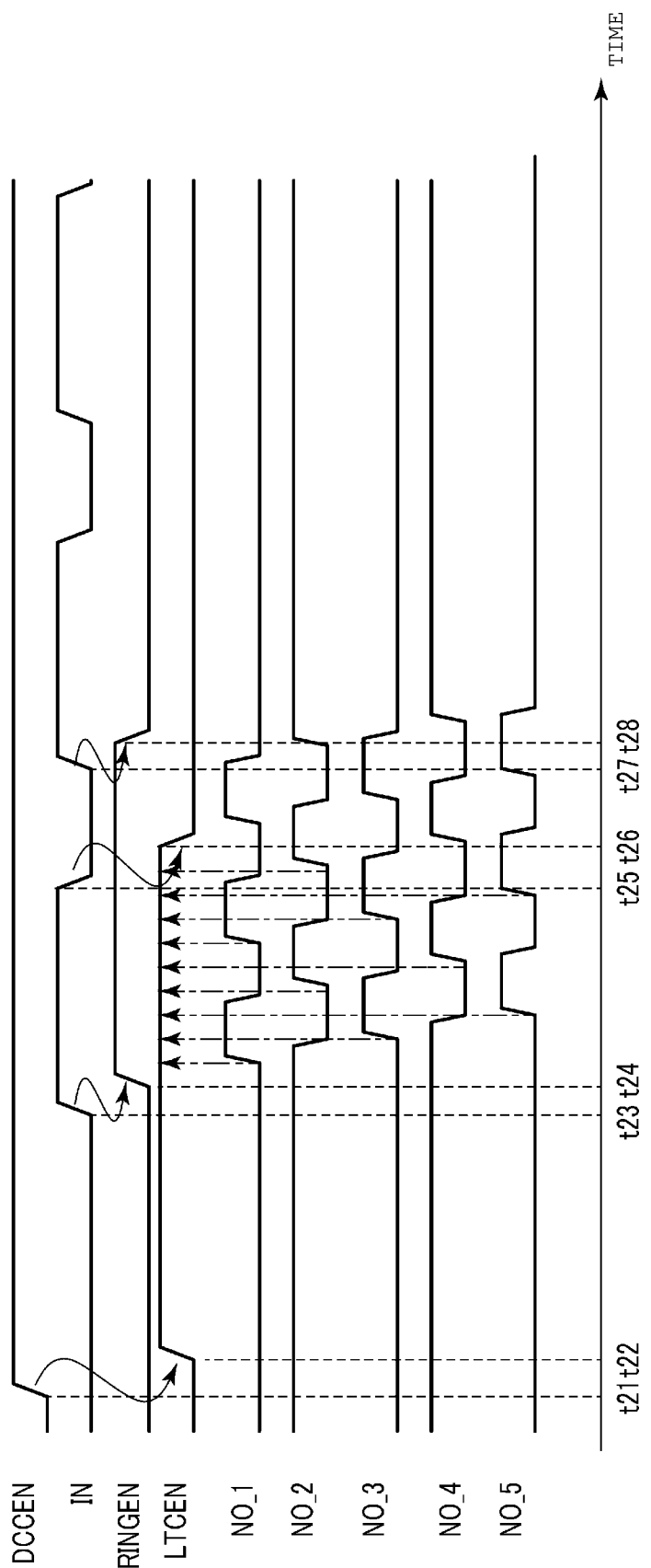
FIG. 23 illustrates several signals of the detection unit according to the second embodiment along with time.

FIG. 23 illustrates several signals of the detection unit 16 according to the second embodiment along with time, and illustrates several signals of the inverter circuit 61, the ring oscillator 64, the fine code detection unit 62, and the course code detection unit 63.

As illustrated in FIG. 23, the enable signal DCCEN goes to a high level at time t21, and thereby, the detection unit 16 is enabled. Since the input clock IN is in a low level, the signal LTCEN goes to a high level at time t22 in response to the enable signal DCCEN which is shifted to a high level.

After that, the signal LTCEN is shifted to a low level at time t26 in response to ending of a high level period of a first one cycle of the input clock IN at time t25. Thus, the signal LTCEN maintains the high level until the high level of the first one cycle of the input clock IN elapses after the detection unit 16 is activated.

At time t23, the input clock IN goes to a high level, and the signal RINGEN goes to a high level at time t24 in response to the input clock. As the signal RINGEN is in a high level, the ring oscillator 64 oscillates. The signal RINGEN maintains the high level until going to a low level at time t28 in response to end of the first one cycle of the input clock IN at time t27. Thus, the ring oscillator 64 oscillates during a period from time t24 to the time t28, that is, during the same period as the first one cycle of the input clock IN.

While the ring oscillator 64 is oscillating, a logic of the output signal NO_ε of the NAND gate 81_ε is inverted each time a delay time between an input and an output of the NAND gate 81_ε elapses from shifting between a high level and a low level of the input of the NAND gate 81_ε. Thus, the signals NO_0 to NO_5 are sequentially switched to an inverted logic each time the delay time of each of the NAND gates 81_1 to 81_5 elapses while the signal RINGEN is in a high level. While the signal LTCEN is in a high level, each of the signals SF_1, SF_2, SF_3, and SF_4 are shifted from a low level to a high level in response to rising of the signals NO_1, NO_2, NO_3, and NO_4. Thus, as long as the signals RINGEN and LTCEN are both in a high level, signals of a low level among the signals SF_1, SF_2, SF_3, and SF_4 go to a high level one by one. A period during which the signals RINGEN and LTCEN are both in a high level corresponds to a period during which the input clock IN is in a high level. Accordingly, the signals SF_1, SF_2, SF_3, and SF_4 partially represent the period during which the input clock IN is in a high level. If all the signals SF_1, SF_2, SF_3 and SF_4 go to a high level, this is represented as the signal OF, the signals SF_1, SF_2, SF_3 and SF_4 are reset to a low level by selection of an output of the selector 714 made by the signal OF, and a loop that is sequentially shifted to a high level starts again.

As described above, the shifting of the signal OF to the high level is counted by the course code detection unit 63. A result of the counting is represented by the signal SC including the signals SC_1, SC_2, and SC_3 as a first bit, a second bit, and a third bit. The ring oscillator 64 oscillates during a high level of the signal RINGEN, and the fine code detection unit 62 receives the output signals NO_1 to NO_4 of the NAND gates 81_1 to 81_4 of the ring oscillator 64 during a high level of both the signals RINGEN and LTCEN. Thus, just during a first high level of the input clock IN, one of the signals SF_1, SF_2, SF_3, and SF_4 goes to a high level each time the delay time of each of the NAND gates 81_1 to 81_4 elapses, and if all the signals SF_1 to SF_4 go to a high level, one loop ends and the number of loops is counted by the course code detection unit 63. By doing so, as illustrated in FIG. 24, information representing a high level period of the first one cycle of the input clock IN is generated by a set of the signals SF_1 to SF_4 and SC_1 to SC_3.

As illustrated in FIG. 24, the logic is shifted from a low level to a high level in the order of the signals SF_1, SF_3, SF_2, and SF_4. After all the signals SF_1, SF_3, SF_2, and SF_4 go to a high level, the signal SC_1 goes to a high level, the signals SF_1 to SF_4 go to a low level, and the second loop starts. Also in the second loop, the logic is shifted to a high level in the order of the signals SF_1, SF_3, SF_2, and SF_4, and after all the signals SF_1, SF_3, SF_2, and SF_4 go to a high level, the signal SC is incremented by 1, and a third loop starts. The others are the same.

Figure 25:
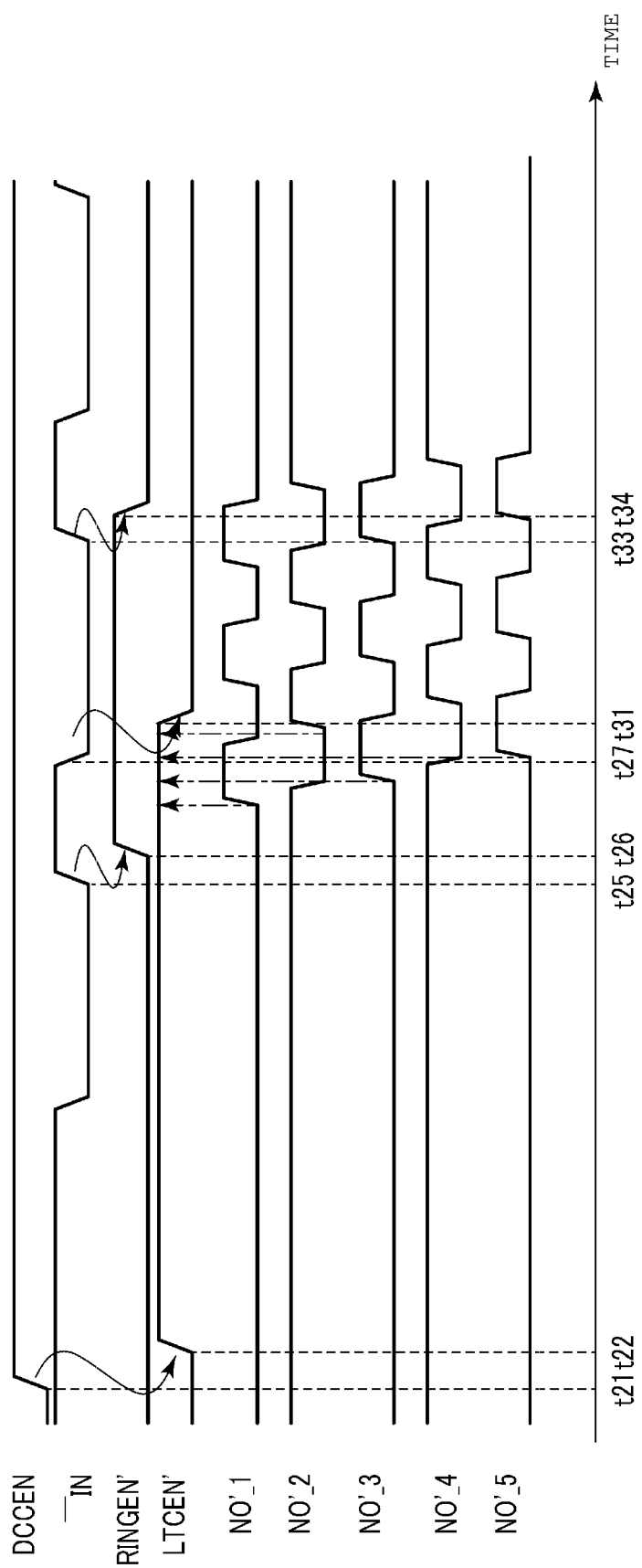
FIG. 25 illustrates the several signals of the detection unit according to the second embodiment along with time.

FIG. 25 illustrates several signals of the detection unit 16 according to the second embodiment along with the time, and illustrates several signals of the enable circuit 61', the ring oscillator 64', the fine code detection unit 62', and the course code detection unit 63'. The signals of the enable circuit 61', the ring oscillator 64', the fine code detection unit 62', and the course code detection unit 63' change in the same manner as the signals of the enable circuit 61, the ring oscillator 64, the fine code detection unit 62, and the course code detection unit 63. That is, the input clock ⁻IN shifts to a high level at time t25, and in response to this, the signal RINGEN' shifts to a high level at time t26. In addition, the input clock ⁻IN shifts to a high level at time t33 after a first one cycle from the time t25 to the time t33 elapse. In response to this, the signal RINGEN' shifts to a low level at time t34. In addition, the signal LTCEN' shifts to a low level at time t31 in response to the input clock ⁻IN shifting to a low level at time t27. Thus, the detection unit 16' detects a period from the time t26 to the time t31, which corresponds to a high level period of the first one cycle of the input clock ⁻IN, in the same manner as the detection unit 16. Then, the detection unit 16' generates information indicating a high level period of the first one cycle of the input clock ⁻IN, according to a set of the signals SF'_1 to SF'_4 and SC'_1 to SC'_3.

The code generation unit 17 can know a length of a high level period of the first one cycle of the input clock IN and a length of a high level period of the first one cycle of the input clock ⁻IN, from the signals SF, SC, SF', and SC'. Thus, the code generation unit 17 can generate the code signals CODE_A and CODE_B from the length of the high level period of each of the first one cycle of the input clocks IN and ⁻IN in the same way as the code generation unit 12 according to the first embodiment.

2.3. Advantage (Effect)

The correction circuit 1 according to the second embodiment detects the high level period of the input clock IN and the high level period of the input clock ⁻IN in the same manner as in the first embodiment and delays a signal based on the input clock IN or ⁻IN by an amount corresponding to a difference between the detected periods to generate the signals CS1 and CS2. Thus, the same advantage as in the first embodiment can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A correction circuit comprising:
   a first detection unit configured to measure a first period of a high level of a first clock;
   a second detection unit configured to measure a second period of a high level of a second clock that is complementary to the first clock;
   a delay unit configured to generate a first delay clock and a second delay clock by delaying the first clock and the second clock, respectively, such that a difference between a delay amount of the first delay clock with respect to the first clock and a delay amount of the second delay clock with respect to the second clock corresponds to a difference between the first period and the second period; and
   a waveform shaping unit configured to generate a third clock having a logic level that is switched based on an edge of the first delay clock and an edge of the second delay clock.

2. The correction circuit according to claim 1,
wherein the delay unit delays the first delay clock more than the second delay clock when the first period is longer than the second period,
wherein the delay unit delays the second delay clock more than the first delay clock when the second period is longer than the first period, and
wherein the delay unit delays the first delay clock and the second delay clock by the same amount when the first period and the second period are substantially equal.

3. The correction circuit according to claim 1,
wherein the delay unit delays the first delay clock and the second delay clock by different amounts, and wherein a difference in the delay amounts is one-half of a difference between the first period and the second period.

4. The correction circuit according to claim 1,
wherein the first detection unit includes a plurality of first delay elements that are connected in series,
wherein the first detection unit outputs a plurality of first signals based on each logic level of an output signal of each of the plurality of first delay elements,
wherein the second detection unit includes a plurality of second delay elements that are connected in series, and
wherein the second detection unit outputs a plurality of second signals based on each logic level of an output signal of each of the plurality of second delay elements.

5. The correction circuit according to claim 4,
wherein the first detection unit includes a plurality of first flip-flops that receive output signals of the plurality of first delay elements, respectively, and
wherein the second detection unit further includes a plurality of second flip-flops that receive output signals of the plurality of second delay elements, respectively.

6. The correction circuit according to claim 1,
wherein the first detection unit includes:
  a plurality of first delay elements that are connected in series in a ring shape;
  a first signal generation unit configured to output a first signal of a plurality of bits, based on an edge of an output signal of each of the plurality of first delay elements; and
  a second signal generation unit configured to count cycles of changes in values of the plurality of bits of the first signal, and
wherein the second detection unit includes:
  a plurality of third delay elements that are connected in series in a ring shape;
  a third signal generation unit configured to output a second signal of a plurality of bits, based on an edge of an output signal of each of the plurality of third delay elements; and
  a fourth signal generation unit configured to count cycles of changes in values of the plurality of bits of the second signal.

7. The correction circuit according to claim 6,
wherein
  n of the first delay elements are connected in series in the ring shape, n being an integer greater than 2,
  the first signal generation unit includes n first flip-flops that receive output signals of the n of the first delay elements, respectively, and
  the second signal generation unit includes a plurality of second flip-flops that are connected in series, a first one of the second flip-flops receives an output signal of an n-th one of the first flip-flops, and wherein
  n of the second delay elements are connected in series in the ring shape,
  the third signal generation unit includes n third flip-flops that receive output signals of the n of the second delay elements, respectively, and
  the fourth signal generation unit includes a plurality of fourth flip-flops that are connected in series, a first one of the fourth flip-flops receives an output signal of an n-th one of the third flip-flops.

8. The correction circuit according to claim 1,
wherein the delay unit includes a first plurality of delay elements that are fewer than a second plurality of delay elements that are required to delay a signal by one-half of a cycle of the first clock.

9. A semiconductor device comprising
an input/output circuit that includes a correction circuit configured to correct a duty cycle of a first clock and a functional circuit to which the corrected first clock is supplied,
wherein the correction circuit includes:
  a first detection unit configured to measure a first period of a high level of the first clock;
  a second detection unit configured to measure a second period of a high level of a second clock that is complementary to the first clock;
  a delay unit configured to generate a first delay clock and a second delay clock by delaying the first clock and the second clock, respectively, such that a difference between a delay amount of the first delay clock with respect to the first clock and a delay amount of the second delay clock with respect to the second clock corresponds to a difference between the first period and the second period; and
  a waveform shaping unit configured to generate a third clock having a logic level that is switched based on an edge of the first delay clock and an edge of the second delay clock.

10. The semiconductor device according to claim 9,
wherein the delay unit delays the first delay clock more than the second delay clock when the first period is longer than the second period,
wherein the delay unit delays the second delay clock more than the first delay clock when the second period is longer than the first period, and
wherein the delay unit delays the first delay clock and the second delay clock by the same amount when the first period and the second period are substantially equal.

11. The semiconductor device according to claim 9,
wherein the delay unit is configured to delay the first delay clock and the second delay clock by different amounts and a difference in the delay amounts is one-half of a difference between the first period and the second period.

12. The semiconductor device according to claim 9,
wherein the first detection unit includes a plurality of first delay elements that are connected in series,
wherein the first detection unit outputs a plurality of first signals based on each logic level of an output signal of each of the plurality of first delay elements,
wherein the second detection unit includes a plurality of second delay elements that are connected in series, and
wherein the second detection unit outputs a plurality of second signals based on each logic level of an output signal of each of the plurality of second delay elements.

13. The semiconductor device according to claim 9,
wherein the first detection unit includes:
 a plurality of first delay elements that are connected in series in a ring shape;
 a first signal generation unit configured to output a first signal of a plurality of bits, based on an edge of an output signal of each of the plurality of first delay elements; and
 a second signal generation unit configured to count cycles of changes in values of the plurality of bits of the first signal, and
wherein the second detection unit includes:
 a plurality of third delay elements that are connected in series in a ring shape;
 a third signal generation unit configured to output a second signal of a plurality of bits, based on an edge of an output signal of each of the plurality of third delay elements; and
 a fourth signal generation unit configured to count cycles of changes in values of the plurality of bits of the second signal.

14. The semiconductor device according to claim 9,
wherein the delay unit includes a first plurality of delay elements that are fewer than a second plurality of delay elements that are required to delay a signal by one-half of a cycle of the first clock.

15. A method of correcting a duty cycle of a first clock that is supplied to a clock correction circuit, said method comprising:
 measuring, in the clock correction circuit, a first period of a high level of the first clock;
 measuring, in the clock correction circuit, a second period of a high level of a second clock that is complementary to the first clock;
 generating, by the clock correction circuit, a first delay clock and a second delay clock by delaying the first clock and the second clock, respectively, such that a difference between a delay amount of the first delay clock with respect to the first clock and a delay amount of the second delay clock with respect to the second clock corresponds according to a difference between the first period and the second period; and
 generating, by the clock correction circuit, a third clock having a logic level which is switched based on an edge of the first delay clock and an edge of the second delay clock.

16. The method according to claim 15,
wherein the first delay clock is delayed more than the second delay clock when the first period is longer than the second period.

17. The method according to claim 15,
wherein the second delay clock is delayed more than the first delay clock when the second period is longer than the first period.

18. The method according to claim 15,
wherein the first delay clock and the second delay clock are delayed by different amounts and a difference in the delay amounts is one-half of a difference between the first period and the second period.

19. The semiconductor device according to claim 12,
wherein the first detection unit includes a plurality of first flip-flops that receive output signals of the plurality of first delay elements, respectively, and
wherein the second detection unit further includes a plurality of second flip-flops that receive output signals of the plurality of second delay elements, respectively.

20. The semiconductor device according to claim 13,
wherein
 n of the first delay elements are connected in series in the ring shape, n being an integer greater than 2,
 the first signal generation unit includes n first flip-flops that receive output signals of the n of the first delay elements, respectively, and
 the second signal generation unit includes a plurality of second flip-flops that are connected in series, a first one of the second flip-flops receives an output signal of an n-th one of the first flip-flops, and
wherein
 n of the second delay elements are connected in series in the ring shape,
 the third signal generation unit includes n third flip-flops that receive output signals of the n of the second delay elements, respectively, and
 the fourth signal generation unit includes a plurality of fourth flip-flops that are connected in series, a first one of the fourth flip-flops receives an output signal of an n-th one of the third flip-flops.

* * * * *

UNITED STATES PATENT AND TRADEMARK OFFICE
CERTIFICATE OF CORRECTION

| | |
|---|---|
| PATENT NO. | : 11,218,141 B2 |
| APPLICATION NO. | : 16/723823 |
| DATED | : January 4, 2022 |
| INVENTOR(S) | : Yasuhiro Hirashima et al. |

It is certified that error appears in the above-identified patent and that said Letters Patent is hereby corrected as shown below:

In the Claims

Column 23, Line 39, delete "according".

Signed and Sealed this
Eighth Day of November, 2022

Katherine Kelly Vidal
*Director of the United States Patent and Trademark Office*